(12) United States Patent
Yang et al.

(10) Patent No.: US 6,909,661 B2
(45) Date of Patent: Jun. 21, 2005

(54) SEMICONDUCTOR MEMORY DEVICE WITH DATA INPUT/OUTPUT ORGANIZATION IN MULTIPLES OF NINE BITS

(75) Inventors: Hyang Ja Yang, Suwon (KR); Yong Hwan Noh, Suwon-si (KR); Yun Jin Cho, Yongin-si (KR); Chul Sung Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/602,111

(22) Filed: Jun. 23, 2003

(65) Prior Publication Data

US 2004/0016975 A1 Jan. 29, 2004

(30) Foreign Application Priority Data

Jul. 26, 2002 (KR) .............................. 10-2002-0044220

(51) Int. Cl.[7] .............................................. G11C 8/00
(52) U.S. Cl. ........................ 365/230.02; 365/230.03; 365/230.06
(58) Field of Search ................. 365/230.02, 230.03, 365/230.06, 230.01, 52, 63, 51, 185.11, 53, 206, 207, 185.03

(56) References Cited

U.S. PATENT DOCUMENTS

| | | | |
|---|---|---|---|
| 4,773,048 A | 9/1988 | Kai ............................ 365/230 |
| 5,249,158 A * | 9/1993 | Kynett et al. ........... 365/185.11 |
| 5,313,603 A | 5/1994 | Takishima ................... 395/425 |
| 5,384,745 A | 1/1995 | Konishi et al. ......... 365/230.03 |
| 5,463,590 A | 10/1995 | Watanabe ............... 365/230.03 |
| 5,483,497 A | 1/1996 | Mochizuki et al. ..... 365/230.03 |
| 5,530,836 A | 6/1996 | Busch et al. ................. 395/477 |
| 5,535,169 A | 7/1996 | Endo et al. ............. 365/230.03 |
| 5,570,320 A | 10/1996 | Runas ..................... 365/230.03 |
| 5,596,740 A | 1/1997 | Quattromani et al. ....... 395/484 |
| 5,642,323 A * | 6/1997 | Kotani et al. .......... 365/230.03 |
| 5,706,231 A * | 1/1998 | Kokubo ...................... 365/200 |
| 5,748,551 A | 5/1998 | Ryan et al. ............. 365/230.03 |
| 5,764,584 A | 6/1998 | Fukiage et al. ........ 365/230.03 |
| 5,914,907 A * | 6/1999 | Kobayashi et al. ..... 365/230.03 |
| 5,966,316 A | 10/1999 | Tsukikawa ................... 365/51 |
| 6,064,621 A | 5/2000 | Tanizaki et al. ........ 365/230.03 |
| 6,072,743 A * | 6/2000 | Amano et al. ......... 365/230.03 |
| 6,088,252 A | 7/2000 | Fujisawa et al. ............... 365/51 |
| 6,404,693 B1 * | 6/2002 | Choi et al. ............. 365/230.03 |
| 6,452,861 B1 * | 9/2002 | Hirose .................... 365/230.06 |
| 6,553,552 B1 * | 4/2003 | Khan et al. .................... 716/10 |
| 6,694,422 B1 * | 2/2004 | Kim ............................. 711/217 |
| 2001/0001262 A1 | 5/2001 | Horiguchi et al. ........... 365/226 |
| 2002/0105097 A1 | 8/2002 | Ahn et al. .................... 257/786 |

* cited by examiner

*Primary Examiner*—Van Thu Nguyen
*Assistant Examiner*—Dang T. Nguyen
(74) *Attorney, Agent, or Firm*—Mills & Onello LLP

(57) ABSTRACT

The invention is directed to data input/output organization system and method in a semiconductor memory device. The memory device has a plurality of memory arrays, in one embodiment, an odd number of memory arrays. The arrays are divided into blocks, and the blocks are divided into segments. A control circuit provides control signals to the memory arrays such that data is input and/or output to and from the memory device in multiples of nine bits. The data bits are input or output simultaneously without the need for multiplexing circuitry. This results in reduced power consumption and increased memory processing speed.

36 Claims, 13 Drawing Sheets

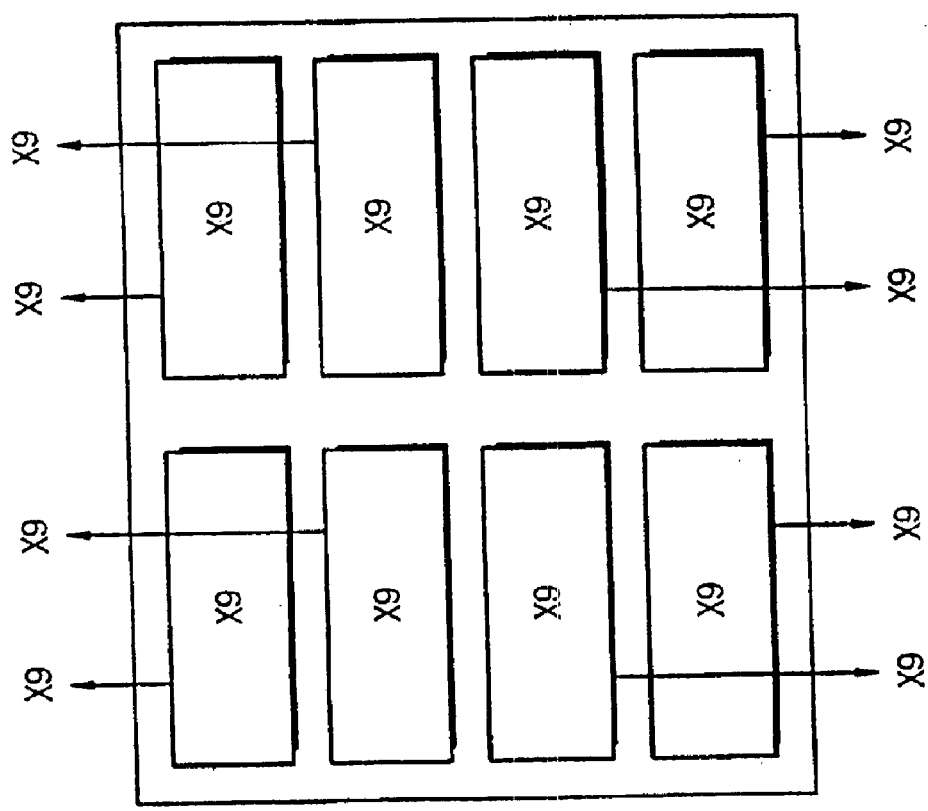

SEMICONDUCTOR MEMORY DEVICE WITH DATA INPUT/OUTPUT ORGANIZATION IN MULTIPLES OF NINE BITS

RELATED APPLICATION

This application relies for priority on Korean Patent Application number 2002-44220, filed on Jul. 26, 2002, the contents of which are incorporated herein in their entirety.

FIELD OF THE INVENTION

The present invention relates to semiconductor memory devices having a plurality of memory arrays, and, in particular, to input/output organization in the memory device.

BACKGROUND OF THE INVENTION

FIG. 1 contains a block diagram of a conventional semiconductor memory device with data input/output organization defined in multiples of nine bits. The semiconductor memory device 10 includes eight memory arrays MAT0 to MAT7 that are arranged in regions of four rows and two columns. FIG. 2 is a detailed block diagram of a memory array of FIG. 1, for example, memory array MAT0. Referring to FIGS. 1 and 2, each of the memory arrays includes a plurality of memory blocks BLK0 to BLK7, a main row decoder circuit MRD, section row decoder circuits SRD, a column decoder & column gate block Y-DEC & Y-GATE and a sense amplifier and write driver block SA & WD.

Referring to FIG. 2, the main row decoder circuit MRD selectively drives main word lines that are arranged in the row direction (not shown). Each of the section row decoder circuits SRD selectively drives section word lines of corresponding memory blocks. The column decoder and column gate block Y-DEC & Y-GATE selects columns of the selected memory block, for example, nine columns in the case of data input/output organization in multiples of nine (hereinafter "×9"), and electrically connects the selected columns to the sense amplifier and write driver block SA & WD.

During a read operation, the sense amplifier and write driver block SA & WD senses data from selected memory block through selected rows, and the sensed data is transferred to a data bus MDL. In FIG. 2, a data bus comprises nine data lines MDL0 to MDL8. During a write operation, the sense amplifier and write driver block SA & WD transfers write data on the data bus MDL to the selected columns of the selected memory block through the column decoder and column gate block Y-DEC & Y-GATE.

FIG. 3 contains a detailed block diagram of a memory block BLK of FIG. 2. FIG. 3 shows the memory block and its peripheral circuit blocks as illustrated in FIG. 2. Referring to FIG. 3, a memory block BLK comprises nine memory block segments IO0 to IO8. A column decoder and column gate block Y-DEC & Y-GATE is a column selection circuit, and it selects one of the columns of each memory block segment IO0 to IO8. That is, nine columns are selected. During a read operation, sense amplifiers SA0 to SA8 sense one bit data from respective memory block segments IO0 to IO8 through the corresponding selected columns, and the selected nine-bit data is transferred to the corresponding data lines.

A read operation of the semiconductor memory device with data input/output organization in multiples of 18 (×18), 36 (×36) or 72 (×72) will be described more fully below. As discussed above, a semiconductor memory device 10 in FIG. 1 comprises eight memory arrays and each array comprises eight memory blocks BLK0 to BLK7, and each memory block comprises nine memory block segments IO0 to IO8.

FIG. 4A shows a method for outputting data relating to a ×72 single data rate (SDR) read operation or a ×36 double data rate DDR read operation. During a ×72 SDR read operation, nine bits of data are read simultaneously in each memory array and eventually seventy-two bits of data will be simultaneously output externally. During a ×36 DDR read operation, nine-bit data is read simultaneously in each memory array as in the ×72 SDR read operation. However, half of the seventy-two bits of data (thirty-six bits) is output externally in synchronization with the rising edge (or falling edge) of a clock signal and the other half (thirty-six bits) is output externally in synchronization with the falling edge (or rising edge) of the clock signal.

FIG. 4B contains a block diagram showing a data output scheme relating to a ×36 SDR read operation or a ×18 DDR read operation. During a ×36 SDR read operation, nine bits of data are simultaneously read in each memory array. Half of the eight memory arrays MAT0 to MAT7 should be selected in order to output thirty-six bits of data externally. As shown in FIG. 4B, the selection of the memory arrays is executed by a multiplexing method. Four multiplexors are required in order to select four memory arrays from the eight memory arrays. For example, a multiplexor MUX0 selects one of the two memory arrays MAT0, MAT2 and a multiplexor MUX1 selects one of the two memory arrays MAT1, MAT3 to output the nine bit-data from the selected memory arrays. A multiplexor MUX2 selects one of the two memory arrays MAT4, MAT6 and outputs the nine-bit data from the selected memory array. A multiplexor MUX3 selects one of the two memory arrays MAT5, MAT7 and outputs the nine-bit data from the selected memory array. Thus, thirty-six bits of data are output externally by the multiplexing method. In the case of a ×18 DDR read operation, half (eighteen bits) of the thirty-six-bit data is output externally in synchronization with the rising edge (or falling edge) of a clock signal and the other half (eighteen bits) is output externally in synchronization with the falling edge (or rising edge) of the clock signal.

FIG. 4C contains a block diagram showing a data output scheme relating to a ×18 SDR read operation or a ×9 DDR read operation. In this approach, six multiplexors MUX0 to MUX5 are used for the purpose of a ×18 SDR read operation. As shown in FIG. 4C, eighteen bits of data may be output externally by a two-stage multiplexing method. Similarly, in the case of a ×9 DDR read operation, half (nine bits) of the eighteen bits of data are output externally in synchronization with the rising edge (or falling edge) of a clock signal and the other half (nine bits) are output externally in synchronization with the falling edge (or rising edge) of the clock signal.

As described above, the nine-bit data is always read from each memory array (or selected memory array). Thus, a semiconductor memory device as shown in FIG. 1 has as a drawback that the device performance or operating characteristics are changed depending on the data input/output organization (×9, ×18, ×36 or ×72). The reason is that data is selectively output using a multiplexing method. For example, during the ×72 SDR/×36 DDR read operation, as shown in FIG. 4A, the selection of memory arrays is not executed using a multiplexing method. On the other hand, during the ×36/×18 SDR read operation or the ×18/×9 DDR read operation, as shown in FIGS. 4B and 4C, the selection of memory arrays is executed using a multiplexing method. The device performance is changed depending on the data input/output organization (×9, ×18, ×36 or ×72). Therefore, it is difficult for the semiconductor memory device as shown in FIG. 1 to maintain uniform performance or uniform operating characteristics regardless of the data input/output organization.

SUMMARY OF THE INVENTION

An object of the present invention is, therefore, to provide a semiconductor memory device having uniform performance regardless of a data input/output organization.

Another object of the present invention is to provide a semiconductor memory device having uniform operating speed regardless of the data input/output organization.

Another object of the present invention is to provide a semiconductor memory device for reducing power consumption.

The invention is directed to a semiconductor memory device and a method of processing data in a semiconductor memory device. The device includes a plurality of memory arrays, a quantity of the memory arrays being an odd number. A control circuit is associated with the memory arrays. The control circuit generates control signals and provides the control signals to the memory arrays such that data can be input and output to and from the semiconductor memory device in multiples of nine bits. In one embodiment, the control signals are sense amplifier control signals. The sense amplifier control signal selectively activates sense amplifiers in the memory arrays. A first of the memory arrays receives two of the control signals. Each of the two control signals can be associated with four bits of data. A second of the memory arrays can receive eight of the control signals, and each of the eight control signals can be associated with a single bit of data. Each of the control signals can be received by a plurality of the memory arrays.

One of the memory arrays is associated with a quantity of bits, the quantities including one bit, two bits, four bits and eight bits. The number of bits depends upon the data input/output operational configuration of the memory device. One of the configurations is a by-nine (×9) operational configuration. In that configuration, each of two of the memory arrays is associated with four bits, and a third memory array is associated with a single bit. In a by-eighteen (×18) operational configuration, each of four of the memory arrays is associated with four bits, and a fifth memory array is associated with two bits. In a by-thirty-six (×36) operational configuration, each of eight of the memory arrays is associated with four bits, and a ninth memory array is associated with four bits. In a by-seventy-two (×72) operational configuration, each of eight of the memory arrays is associated with eight bits, and a ninth memory array is associated with eight bits.

In one embodiment, the memory arrays are comprised of a plurality of first memory arrays and at least one second memory array. The arrays are arranged in three columns and three rows. In one embodiment, a third memory array and/or a peripheral circuit, which can include the control circuitry of the invention, is included in the memory device. The third memory array can be a redundant array to at least one of the first and second memory arrays. The third array and/or the peripheral circuitry can be formed in the memory circuit such that it divides at least one of the memory arrays. In one particular embodiment, the redundant memory array and/or the peripheral circuitry divides the memory array in half.

In one embodiment, each memory array comprises eight memory blocks, and each memory block comprises eight memory segments. The memory device of the invention can be a static random-access memory (SRAM).

In one embodiment, the plurality of memory arrays all have the same input/output configuration. The memory arrays may all have the same memory density, or at least two of the memory arrays have different memory densities.

In one embodiment, the memory device includes nine memory arrays. In another embodiment, the quantity of memory arrays is an integer multiple of nine.

In one embodiment, the memory arrays comprise a plurality of first memory arrays which are selectively activated during a read or write operation and a second memory array which is activated by the control signals during every read or write operation.

The invention provides numerous advantages over other memory input/output organizational configurations. For example, by using an odd number of memory arrays, data can be readily input and output from the memory in multiples of nine bits, without using complex circuitry used in prior approaches. Specifically, the invention can be implemented without using the multiplexing schemes found in prior art approaches. The elimination of this complexity substantially reduces the power consumption of the memory device of the invention and also results in an increase in the speed of operation.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIGS. 4A–4C contain block diagrams illustrating methods for outputting data relating to a ×72/×36/×18 SDR read operation or a ×36/×18/×9 DDR read operation in the memory device of FIG. 1.

DETAILED DESCRIPTION OF PREFERRED EMBODIMENTS OF THE INVENTION

Figure 5:
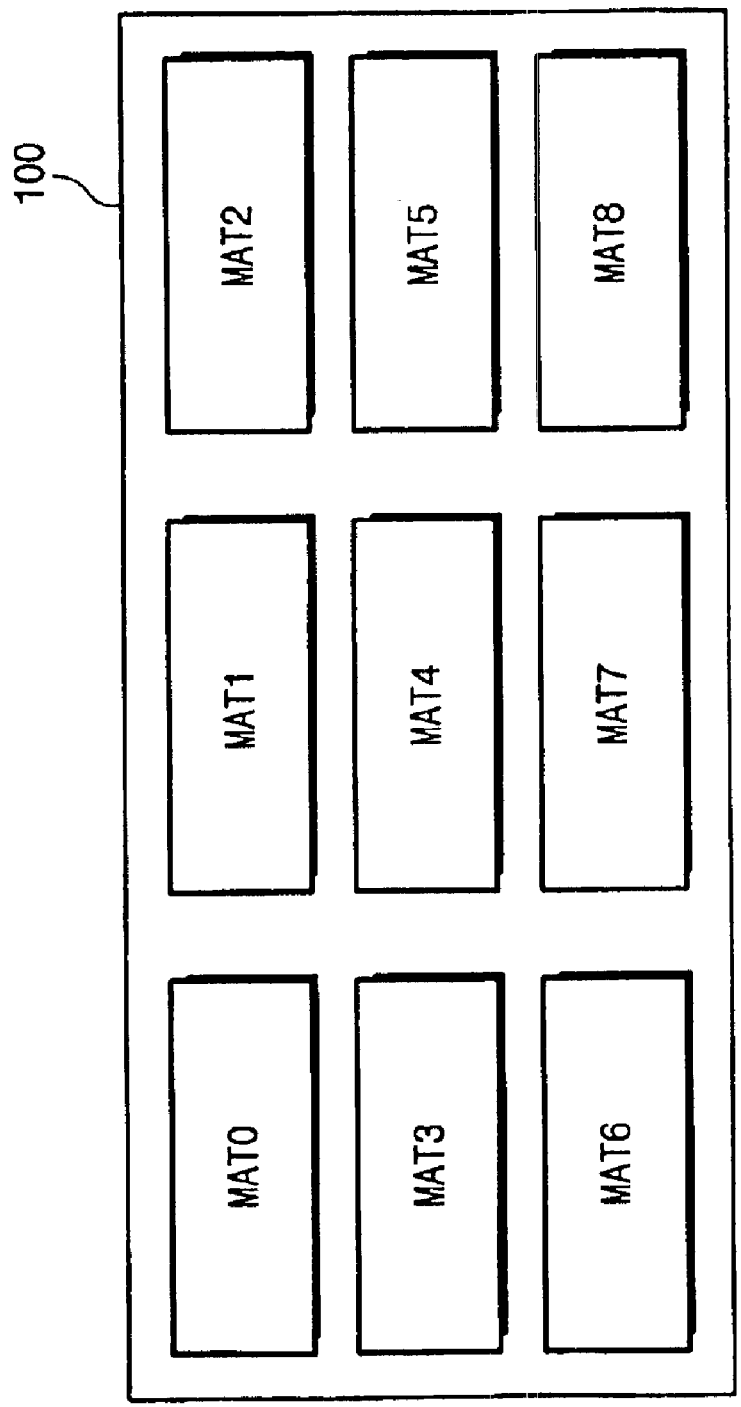
FIG. 5 is a block diagram of a semiconductor memory device with data input/output organization in multiples of nine bits in accordance with the present invention.

FIG. 5 is a block diagram of a semiconductor memory device 100 according to an embodiment of the present invention. Referring to FIG. 5, the semiconductor memory device 100 according to the present invention may be a static random access memory (SRAM). It will be understood, however, to one skilled in the art, that a semiconductor memory device 100 according to the present invention may be another type of memory device, for example, DRAM, flash memory device, FRAM, EEPROM, ROM, etc.

In one embodiment, a semiconductor memory device 100 according to the present invention includes nine memory arrays MAT0 to MAT8 that are arranged in regions of three rows and three columns. For example, if the density of the semiconductor memory device 100 as shown in FIG. 5 is 72 M bits, the density of each memory array is 8 M bits. In one embodiment, all of the arrays have the same density. However, the invention is applicable to systems in which all of the arrays do not have the same density.

Figure 6:
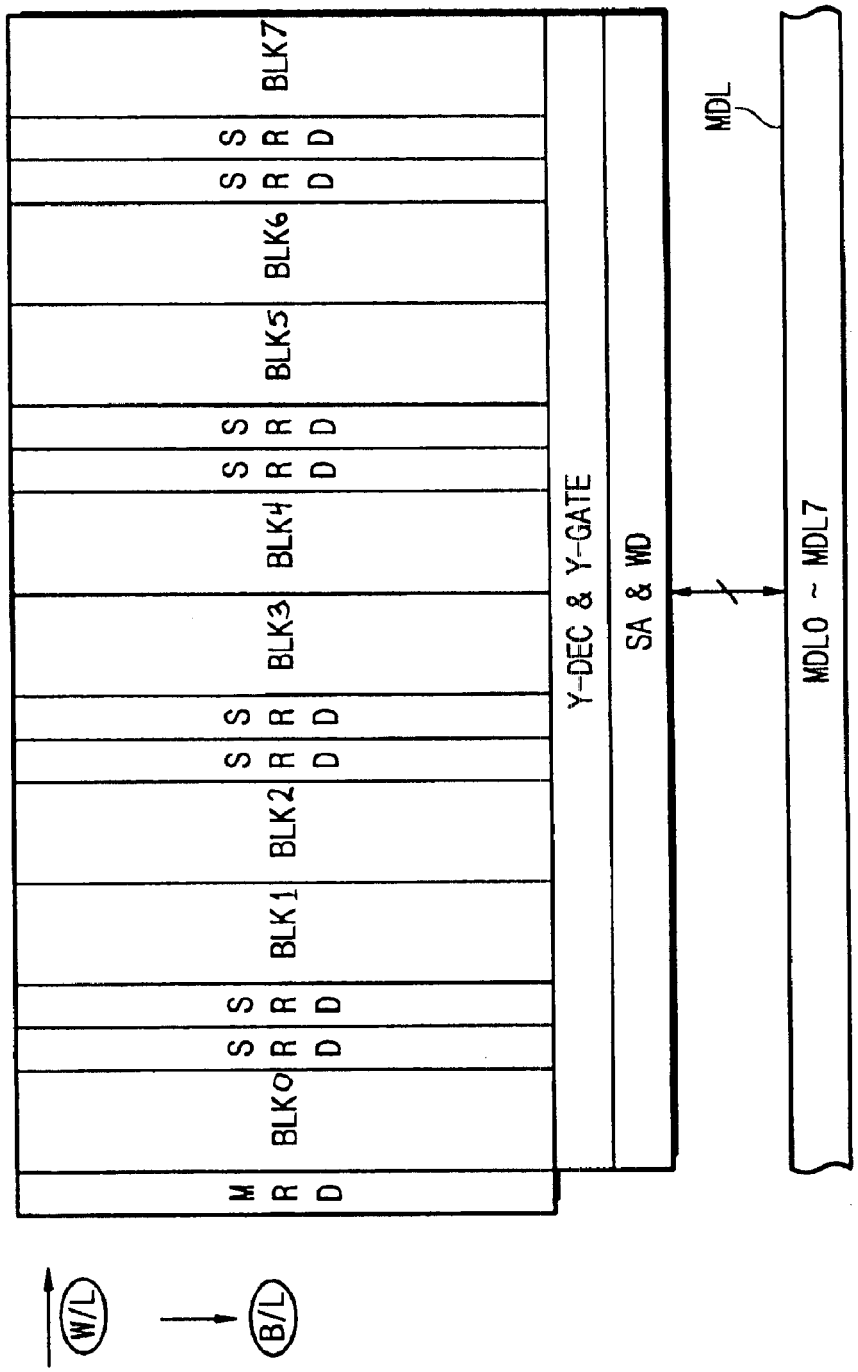
FIG. 6 is a block diagram of a memory array in the device of FIG. 5.

Each memory array in the semiconductor memory device according to the present invention includes a plurality of memory blocks for storing data. FIG. 6 is a block diagram illustrating one of the memory arrays, for example, MAT0, shown in FIG. 5. Referring to FIGS. 5 and 6, in one embodiment of the present invention, each memory array MAT0 to MAT8 includes eight memory blocks BLK0 to BLK7. For example, if the density of each memory array is 8 M bits, the density of each memory block is 1 M bits.

Referring to FIG. 6, a memory array (for example, MAT0) further includes a main row decoder circuit MRD, section row decoder circuits SRD, a column decoder and column gate block Y-DEC & Y-GATE and a sense amplifier and write driver block SA & WD. The main row decoder circuit MRD selectively drives main word lines that are arranged in the row direction (not shown). Each of the section row decoder circuits SRD selectively drives section word lines of the corresponding memory blocks (not shown). A column decoder and column gate block Y-DEC & Y-GATE selects columns of the selected memory block, for example, eight columns in the case of a data input/output organization of x9.

During a read operation, the sense amplifier and write driver block SA & WD senses data from selected memory block through selected rows, and the sensed data is transferred to a data bus MDL. During a write operation, the sense amplifier and write driver block SA & WD transfers write data on the data bus MDL to the selected columns of the selected memory block through the column decoder and column gate block Y-DEC & Y-GATE. According to one embodiment of the present invention, the data bus MDL comprises eight data lines MDL0 to MDL7, and each memory block comprises eight memory block segments.

Figure 7:
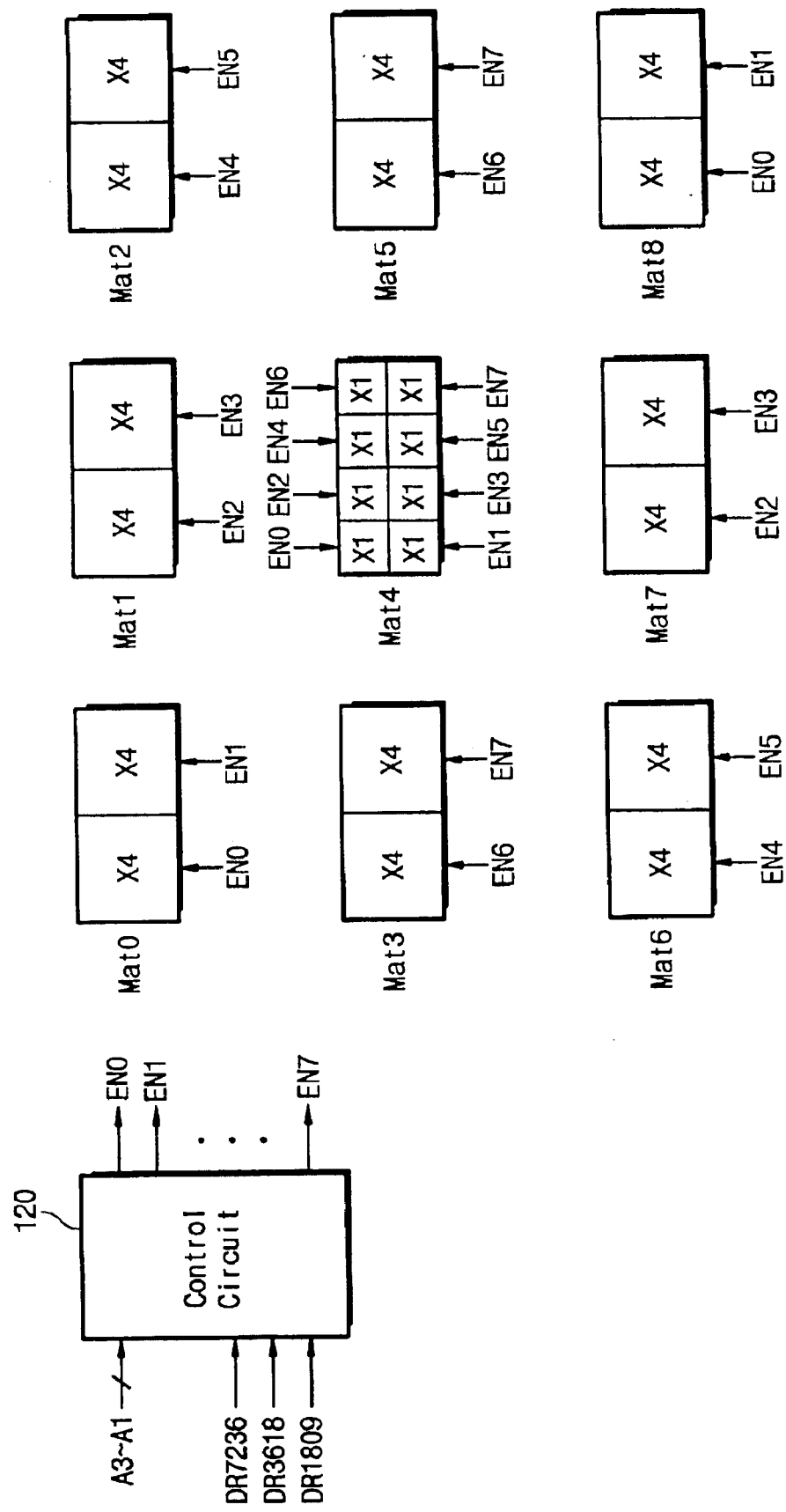
FIG. 7 is a block diagram of a control circuit in accordance with the present invention.

FIG. 7 contains a block diagram which illustrates an accessing approach according to the present invention, using the memory block segments. Referring to FIG. 7, the semiconductor memory device 100 includes a control circuit 120 that controls each sense amplifier and each write driver of memory blocks in each memory array. For example, the control circuit 120 generates enable signals EN0 to EN7 in response to mode selection signals DR7236, DR3618 and DR1809 and address signals A1 to A3. Four-bit data or eight-bit data is read in each memory array MAT0 to MAT3 and MAT5 to MAT8, depending on the selective activation of the enable signals EN0 to EN7. Also, one-bit data, two-bit data, four-bit data or eight-bit data is read in the memory array MAT4, depending on the selective activation of the enable signals EN0 to EN7.

Figure 4B:
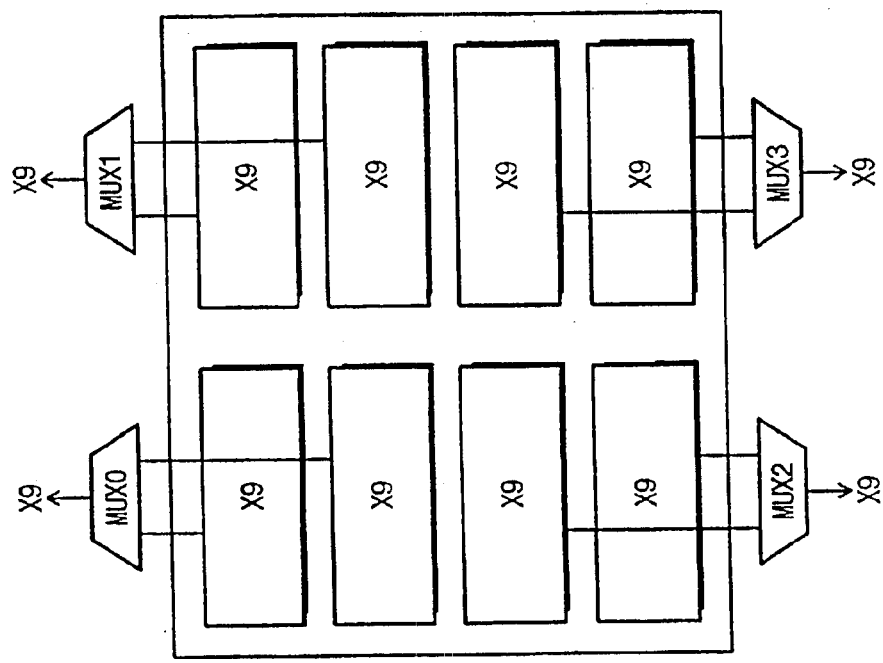
Figure 4C:
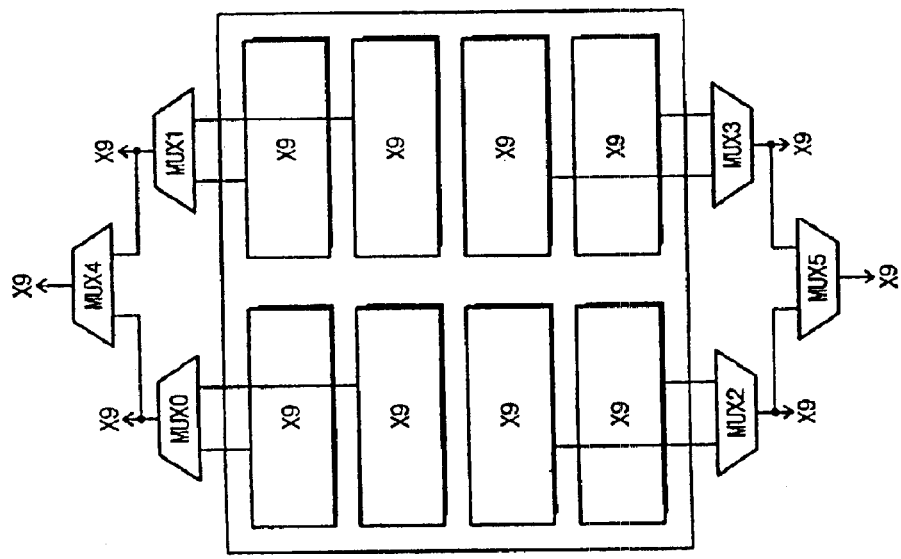

For example, during a x9 SDR read operation, if an enable signal EN7 is activated, four-bit data is read in each memory array MAT3, MAT5, and one-bit data is read in the memory array MAT4. Thus, the nine-bit data is output externally without using a multiplexing method as shown in FIGS. 4B–4C. During a x18 SDR read operation, if enable signals EN0, EN4 are activated, four-bit data is read in each memory array MAT0, MAT2, MAT6 and MAT8, and two-bit data is read in the memory array MAT4. Thus, eighteen bits of data are output externally without using a multiplexing method.

Figure 8:
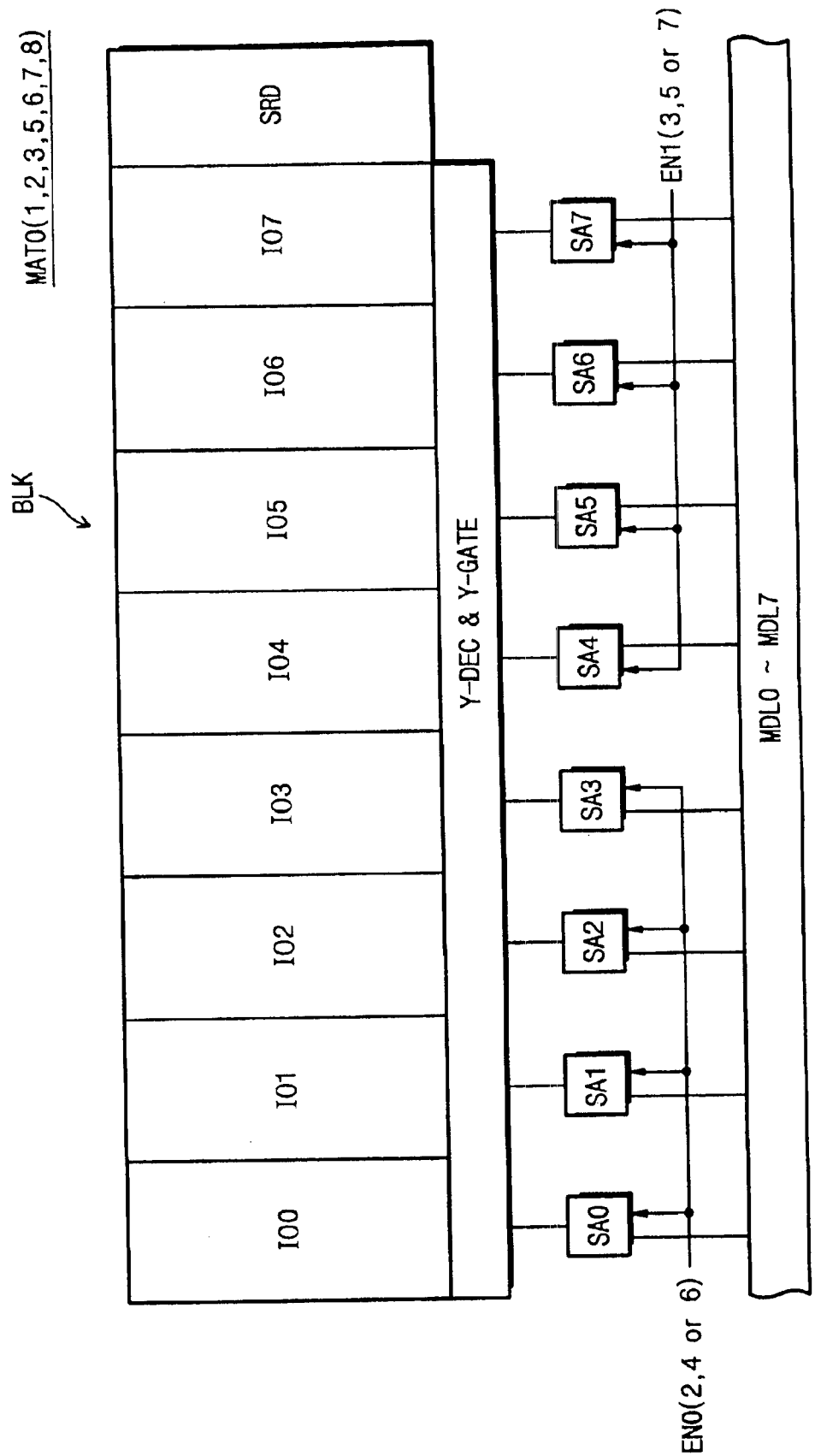
FIG. 8 is a block diagram of a memory array in the device of FIG. 5.

FIG. 8 shows a memory block and its peripheral circuit blocks of FIG. 7. A memory block BLK comprises eight memory block segments IO0 to IO7 as shown in FIG. 8. A section row decoder circuit SRD is a row selection circuit. The SRD selects at least one of the section word lines (not shown) arranged in the row direction in the memory blocks. A column decoder and column gate block Y-DEC & Y-GATE is a column selection circuit which selects columns of a memory block (for example, eight columns). That is, one column is selected per each memory block segment. The columns selected by a column decoder and column gate block Y-DEC & Y-GATE are connected to corresponding sense amplifiers SA0 to SA3. Four sense amplifiers located on one side SA0 to SA3 are controlled by enable signals EN0, EN2, EN4 and EN6, and four sense amplifiers located on the other side SA4 to SA7 are controlled by enable signals EN1, EN3, EN5 and EN7.

For example, if an enable signal EN0 is activated and an enable signal EN1 is inactivated, then sense amplifiers SA0 to SA3 execute a sensing operation, and sense amplifiers SA4 to SA7 do not execute a sensing operation. Therefore, four-bit data is read. If enable signals EN0 and EN1 are activated, all the sense amplifiers SA0 to SA7 execute a sensing operation. Thus, eight-bit data is read. Four-bit data (or eight-bit data) is read or written in each memory arrays MAT0 to MAT3, MAT5 to MAT8. For the sake of convenience, write drivers are not shown in FIG. 8. However, it is apparent to one of skill in the art that those write drivers are controlled by the same method as the sense amplifiers SA0 to SA7.

Figure 9:
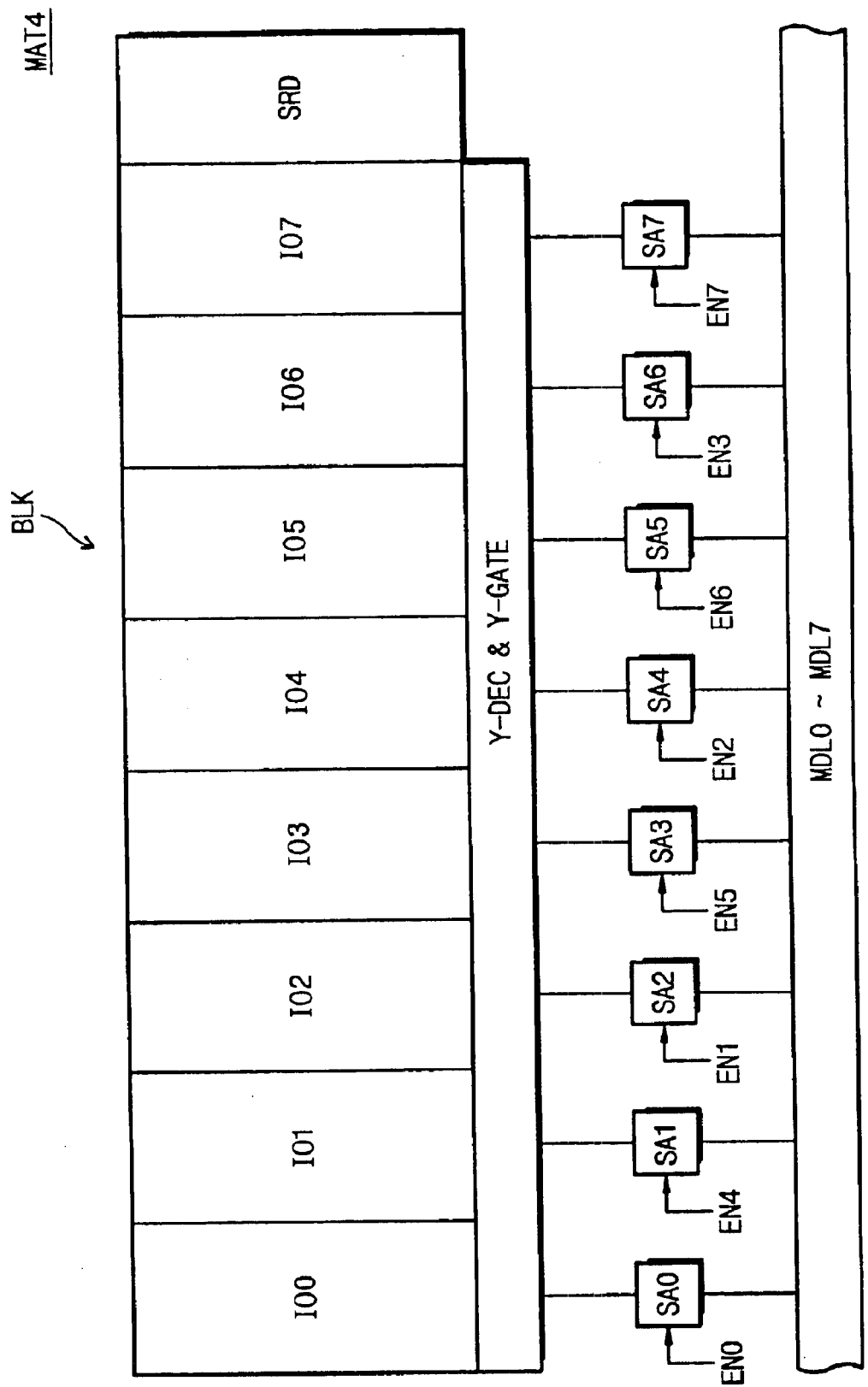
FIG. 9 is a block diagram of another memory array in the device of FIG. 5.

FIG. 9 shows a memory block of the memory array MAT4 and its peripheral circuit blocks as shown in FIG. 7. Circuit elements in FIG. 9 are the same as circuit elements in FIG. 8 except for the method for controlling sense amplifiers SA0 to SA7. Sense amplifiers of the corresponding memory blocks of the memory array MAT4 located in the center of the memory circuit of the invention (see FIG. 5) are controlled independently. According to these control methods, one-bit data, two-bit data, four-bit data or eight-bit data can be output from the memory array MAT4. For the sake of convenience, write drivers are not shown in FIG. 9. However, it is apparent to one of skill in the art that those write drivers are controlled by the same method as sense amplifiers SA0 to SA7.

Figure 10:
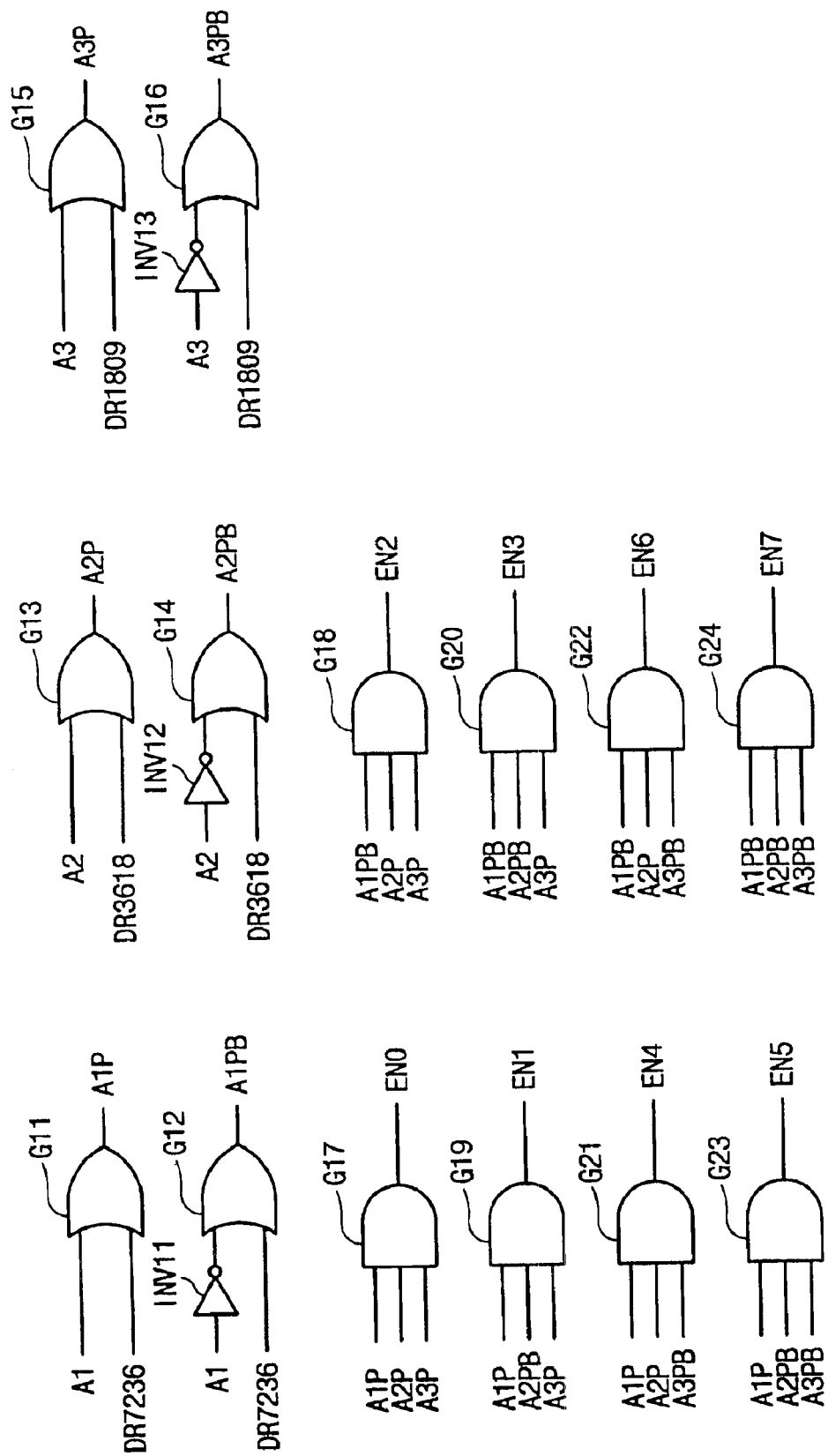
FIG. 10 is a circuit diagram of a control circuit as shown in FIG. 7.

FIG. 10 illustrates a circuit diagram showing a preferred embodiment of a control circuit shown in FIG. 7. Referring to FIG. 10, a control circuit 120 in accordance with the present invention generates enable signals EN0 to EN7 in response to mode selection signals DR7236, DR3618 and DR1809 and address signals A1 to A3, and as shown in FIG. 10, includes six OR-gates G11 to G16, three inverters INV11 to INV13 and eight AND gates G17 to G24. The mode selection signal DR7236 is used for selecting a x72 SDR read operation mode or a x36 DDR read operation mode, and the mode selection signal DR3618 is used for selecting a x36 SDR read operation mode or a x18 DDR read operation mode, and the mode selection signal DR1809 is used for selecting a x18 SDR read operation mode or a x9

DDR read operation mode. It is apparent to one of skill in the art that the mode selection signals may be programmed internally using an option circuit, or programmed externally.

Table 1 shows the logic status of the mode selection signals DR7236, DR3618 and DR1809 according to each operation mode.

With reference to Table 1, if all of mode selection signals DR7236, DR3618 and DR180) have a logic "H" (high) level, then a ×72 SDR read operation or a ×36 DDR read operation is executed. At this time, all of enable signals EN0 to EN7 have a logic "H" level regardless of the logic status of the address signals A1 to A3.

TABLE 1

|  | X9SDR | X18SDR OR X9DDR | X36SDR OR X18DDR | X72SDR OR X36DDR |
|---|---|---|---|---|
| DR7236 | L | L | L | H |
| DR3618 | L | L | H | H |
| DR1809 | L | H | H | H |

If the mode selection signal DR7236 has a logic "L" (low) level and the mode selection signals DR3618, DR1809 have a logic "H" level, then a ×36 SDR read operation or a ×18 DDR read operation is executed. If the address signal A1 has a logic "L" level, enable signals EN2, EN3, EN6 and EN7 are activated and enable signals EN0, EN1, EN4 and EN5 are inactivated, regardless of the address signals A2, A3. If the address signal A1 has a logic "H" level, enable signals EN0, EN1, EN4 and EN5 are activated and enable signals EN2, EN3, EN6 and EN7 are inactivated, regardless of the address signals A2, A3.

If the mode selection signals DR7236, DR3618 have a logic "L" level and the mode selection signal DR1809 has a logic "H" level, then a ×18 SDR read operation or a ×9 DDR read operation is executed. The logic status of the enable signals EN0 to EN7 is decided regardless of the address signals A3. If the addresses A2A1 have logic "LL" levels, then the enable signals EN3, EN7 are activated. If the addresses A2A1have logic "LH" levels, then the enable signals EN1, EN5 are activated. If the addresses A2A1 have logic "HL" levels, then the enable signals EN2, EN6 are activated. If the addresses A2A1have logic "HH" levels, then the enable signals EN0, EN4 are activated.

If all of mode selection signals DR7236, DR3618 and DR1809 have a logic "L" level, then a ×9 SDR read operation is executed. If the addresses A3A2A1 have logic "LLL" levels, then the enable signal EN7 is activated. If the addresses A3A2A1 have logic "LLH" levels, then the enable signal EN5 is activated. If the addresses A3A2A1 have logic "LHL" levels, then the enable signal EN6 is activated. If the addresses A3A2A1 have logic "LHH" levels, then the enable signal EN4 is activated. If the addresses A3A2A1 have logic "HLL" levels, then the enable signal EN3 is activated. If the addresses A3A2A1 have logic "HLH" levels, then the enable signal EN1 is activated. If the addresses A3A2A1 have logic "HHL" levels, then the enable signal EN2 is activated. If the addresses A3A2A1 have logic "HHH" levels, then the enable signal EN0 is activated.

Table 2 summarizes the above described combinations of logic states of the mode selection signals, addresses and enable signals.

TABLE 2

| A3A2A1 | X9SDR | X18SDR OR X9DDR | X36SDR OR X18DDR | X72SDR OR X36DDR |
|---|---|---|---|---|
| 000 | EN7 | EN3, EN7 | EN2, EN3, EN6, EN7 | EN0–EN7 |
| 001 | EN5 | EN1, EN5 | EN0, EN1, EN4, EN5 | EN0–EN7 |
| 010 | EN6 | EN2, EN6 | EN2, EN3, EN6, EN7 | EN0–EN7 |
| 011 | EN4 | EN0, EN4 | EN0, EN1, EN4, EN5 | EN0–EN7 |
| 100 | EN3 | EN3, EN7 | EN2, EN3, EN6, EN7 | EN0–EN7 |
| 101 | EN1 | EN1, EN5 | EN0, EN1, EN4, EN5 | EN0–EN7 |
| 110 | EN2 | EN2, EN6 | EN2, EN3, EN6, EN7 | EN0–EN7 |
| 111 | EN0 | EN0, EN4 | EN0, EN1, EN4, EN5 | EN0–EN7 |

The ×9 (×18, ×36 or ×72) SDR read operation of the semiconductor memory device 100 in accordance with the present invention will now be described. Mode selection signals DR7236, DR3618 and DR1809 are set to a logic "H" level in order to execute a ×72 SDR read operation. Because mode selection signals DR7236, DR3618 and DR1809 have a logic "H" level, enable signals EN0 to EN7 are activated regardless of the logic status of the address signals A3A2A1. Thus sense amplifiers of the selected memory block of each memory array MAT0 to MAT8 are activated. Therefore, seventy-two-bit data is read and output externally at one time during a ×72 SDR read operation. During a ×36 DDR read operation, half (thirty-six-bit data) of the seventy-two-bit data is output externally in synchronization with the rising edge (or falling edge) of a clock signal and the other half (thirty-six-bit data) is output externally in synchronization with the falling edge (or rising edge) of the clock signal.

With the mode selection signal DR1809 in a logic "H" level and the mode selection signal DR7236 in a logic "L" level, if the address signal A1 has a logic "L" level, enable signals EN2, EN3, EN6, EN7 are activated. Eight bits of data are output from each memory array MAT1, MAT3, MAT5, MAT7 as a result of being activated by all of the sense amplifiers of selected memory blocks of each memory array MAT1, MAT3, MAT5, MAT7. At the same time, four-bit data is output from the memory array MAT4 as a result of being activated by four sense amplifiers of selected memory blocks of the memory array MAT4. Therefore, thirty-six-bit data is output from memory arrays MAT1, MAT3, MAT4, MAT5, MAT7 without using a multiplexing method. The thirty-six-bit data is output at one time externally in SDR mode. In a DDR mode, half (eighteen-bit data) of the thirty-six-bit data is output externally in synchronization with the rising edge (or falling edge) of a clock signal and the other half (eighteen-bit data) is output externally in synchronization with the falling edge (or rising edge) of the clock signal. If the address signal has a logic "H" level, enable signals EN0, EN1, EN4, EN5 are activated. According to the same method as describe above, eight bits of data are output from each memory array MAT0, MAT2, MAT6, MAT8 and four-bit data is output from the memory array MAT4.

The ×18 SDR read operation is executed by setting mode selection signals DR7236, DR3618 in a logic "L" level and the mode selection signal DR1809 in a logic "H" level. As described above, two enable signals are activated according to the address signals A3A2A1 in this case. For example, if the address signals A2, A1 have a logic "H" level, enable signals EN3, EN7 are activated and four bits of data are output from each memory array MAT1, MAT3, MAT5, MAT7 and two-bit data is output from the memory array MAT4. Therefore, eighteen bits of data are output from memory arrays MAT1, MAT3, MAT4, MAT5, MAT7 without using a multiplexing method. The eighteen-bit data is output at one time externally in the SDR mode. In the DDR mode, half (nine-bit data) of the eighteen bit data is output externally in synchronization with the rising edge (or falling edge) of a clock signal and the other half (nine-bit data) is output externally in synchronization with the falling edge (or rising edge) of the clock signal. If the combination of the address signals A3, A2, A1 is different from the above, eighteen-bit data may be read from five memory arrays in the same method as described above.

If mode selection signals DR7236, DR3618, DR1809 have a logic "L" level, a ×9 SDR read operation can be executed. If address signals A3, A2, A1 have logic "LLL" levels, the enable signal EN7 is activated and four bits of data are output from each memory array MAT3, MAT5 and one bit data is output from the memory array MAT4. Therefore, nine bits of data can be read from memory arrays without using a multiplexing method. If the combination of the address signals A3, A2, A1 is different from the above, the nine-bit data may be read from three memory arrays in the same method as described above.

Figure 11:
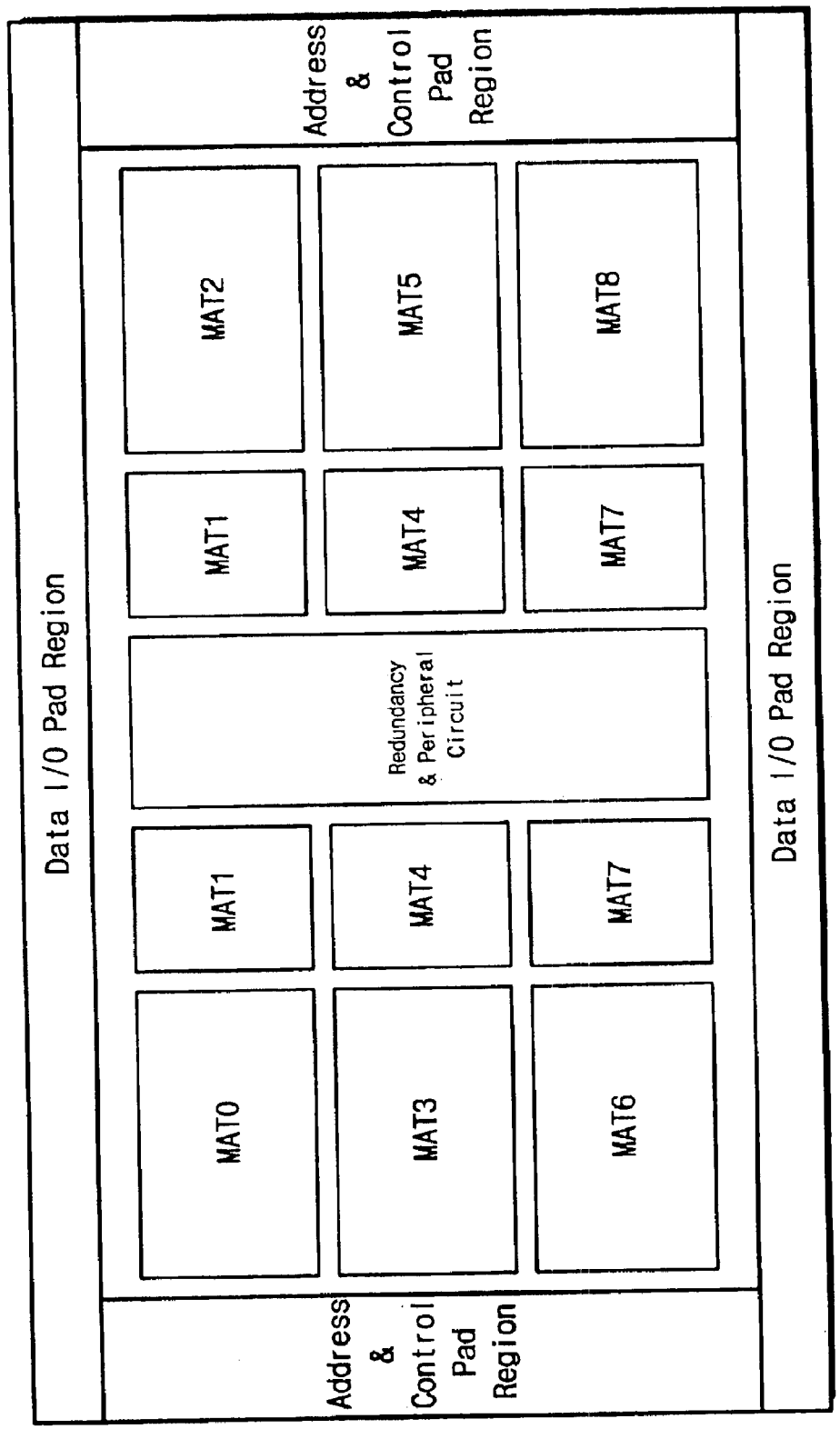
FIG. 11 is a schematic plan view illustrating a layout scheme of a semiconductor memory device having a peripheral circuit and a redundancy circuit in accordance with the present invention.

FIG. 11 shows a layout of a semiconductor memory device having a peripheral circuit and a redundancy circuit in accordance with the present invention. Referring to FIG. 11, the semiconductor memory device in accordance with the present invention has each of the memory arrays MAT1, MAT4, MAT7 of the second column divided in two sections. In one embodiment, each of the arrays is divided in half. The peripheral circuit and the redundancy circuit are located in the divided region. Data I/O pads, address and control pads and data I/O circuits are located in an edge region of the chip.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device, comprising:
   a plurality of first memory arrays, a quantity of the first memory arrays being an even number;
   a single second memory array comprising a plurality of memory blocks; and
   a control circuit associated with each of the first and second memory arrays, the control circuit generating control signals and providing the control signals to the first and second memory arrays such that data is input and output to and from the semiconductor memory device in multiples of nine bits.

2. The semiconductor memory device of claim 1, wherein the control signals are sense amplifier control signals, the sense amplifier control signals selectively activating sense amplifiers in the memory arrays.

3. The semiconductor memory device of claim 1, wherein one of the memory arrays is associated with a quantity of bits of one of one, two, four and eight bits, depending on a data input/output operational configuration of the memory device.

4. The semiconductor memory device of claim 1, wherein, in a by-nine operational configuration, each of two of the first memory arrays is associated with four bits, and the second memory array is associated with a single bit.

5. The semiconductor memory device of claim 1, wherein, in a by-eighteen operational configuration, each of four of the first memory arrays is associated with four bits, and the second memory array is associated with two bits.

6. The semiconductor memory device of claim 1, wherein, in a by-thirty-six operational configuration, each of four of the first memory arrays is associated with eight bits, and the second memory array is associated with four bits.

7. The semiconductor memory device of claim 1, wherein, in a by-seventy-two operational configuration, each of eight of the first memory arrays is associated with eight bits, and the second memory array is associated with eight bits.

8. The semiconductor memory device of claim 1, wherein the memory arrays are arranged in three columns and three rows.

9. The semiconductor memory device of claim 8, further comprising a third memory array redundant to at least one of the first and second memory arrays.

10. The semiconductor memory device of claim 9, wherein the at least one of the first and second memory arrays is divided in half.

11. The semiconductor memory device of claim 8, further comprising a peripheral circuit formed on the semiconductor memory device.

12. The semiconductor memory device of claim 11, wherein the peripheral circuit is formed dividing at least one of the first and second memory arrays.

13. The semiconductor memory device of claim 12, wherein the at least one of the first and second memory arrays is divided in half.

14. The semiconductor memory device of claim 8, further comprising a third memory array redundant to at least one of the first and second memory arrays and a peripheral circuit formed on the semiconductor memory device.

15. The semiconductor memory device of claim 14, wherein the third memory array and the peripheral circuit are formed dividing at least one of the first and second memory arrays.

16. The semiconductor memory device of claim 1, wherein each memory array comprises eight memory blocks and each memory block comprises eight memory segments.

17. The semiconductor memory device of claim 1, wherein all of the plurality of memory arrays have the same input/output operational configuration.

18. The semiconductor memory device of claim 1, wherein the quantity of memory arrays is nine.

19. The semiconductor memory device of claim 1, wherein the quantity of memory arrays is an integer multiple of nine.

20. The semiconductor memory device of claim 1, wherein the memory arrays comprise a plurality of first memory arrays which are selectively activated during a read or write operation and a second memory array which is activated by the control signals during every read or write operation.

21. The semiconductor memory device of claim 1, wherein the memory arrays all have the same memory density.

22. A method of processing data in a semiconductor memory device, comprising:
   providing a plurality of first memory arrays, a quantity of the first memory arrays being an even number;
   providing a single second memory array comprising a plurality of memory blocks; and
   generating control signals and providing the control signals to the first and second memory arrays such that data is input and output to and from the semiconductor memory device in multiples of nine bits.

23. The method of claim 22, wherein the control signals are sense amplifier control signals, the sense amplifier control signals selectively activating sense amplifiers in the memory arrays.

24. The method of claim 22, wherein one of the memory arrays is associated with a quantity of bits of one of one, two, four and eight bits, depending on a data input/output operational configuration of the memory device.

25. The method of claim 22, wherein, in a by-nine operational configuration, each of two of the first memory arrays is associated with four bits, and the second memory array is associated with a single bit.

26. The method of claim 22, wherein, in a by-eighteen operational configuration, each of four of the first memory arrays is associated with four bits, and the second memory array is associated with two bits.

27. The method of claim 22, wherein, in a by-thirty-six operational configuration, each of four of the first memory arrays is associated with eight bits, and the second memory array is associated with four bits.

28. The method of claim 22, wherein, in a by-seventy-two operational configuration, each of eight of the first memory arrays is associated with eight bits, and the second memory array is associated with eight bits.

29. The method of claim 22, wherein, in a by-nine operational configuration, each of the first memory arrays and the second memory array is associated with one bit of data.

30. The method of claim 22, wherein, in a by-eighteen operational configuration, each of the first memory arrays and the second memory array is associated with two bits of data.

31. The method of claim 22, wherein, in a by-thirty-six operational configuration, each of the first memory arrays and the second memory array is associated with four bits of data.

32. The method of claim 22, wherein each memory array comprises eight memory blocks and each memory block comprises eight memory segments.

33. The method of claim 22, wherein all of the plurality of memory arrays have the same input/output operational configuration.

34. The method of claim 22, wherein the quantity of memory arrays is nine.

35. The method of claim 22, wherein the quantity of memory arrays is an integer multiple of nine.

36. The method of claim 22, wherein the memory arrays comprise a plurality of first memory arrays which are selectively activated during a read or write operation and a second memory array which is activated by the control signals during every read or write operation.

* * * * *

UNITED STATES PATENT AND TRADEMARK OFFICE
CERTIFICATE OF CORRECTION

PATENT NO.       : 6,909,661 B2
APPLICATION NO.  : 10/602111
DATED            : June 21, 2005
INVENTOR(S)      : Yang et al.

It is certified that error appears in the above-identified patent and that said Letters Patent is hereby corrected as shown below:

PLEASE DELETE THE SPEC COLUMNS 1 THRU COLUMNS 12 AND INSERT COLUMNS 1 THRU COLUMNS 12 AS ATTACHED.

Signed and Sealed this

Twentieth Day of February, 2007

JON W. DUDAS
*Director of the United States Patent and Trademark Office*

SEMICONDUCTOR MEMORY DEVICE WITH DATA INPUT/OUTPUT ORGANIZATION IN MULTIPLES OF NINE BITS

RELATED APPLICATION

This application relies for priority on Korean Patent Application number 2002-44220, filed on Jul. 26, 2002, the contents of which are incorporated herein in their entirety.

FIELD OF THE INVENTION

The present invention relates to semiconductor memory devices having a plurality of memory arrays, and, in particular, to input/output organization in the memory device.

BACKGROUND OF THE INVENTION

Figure 1:
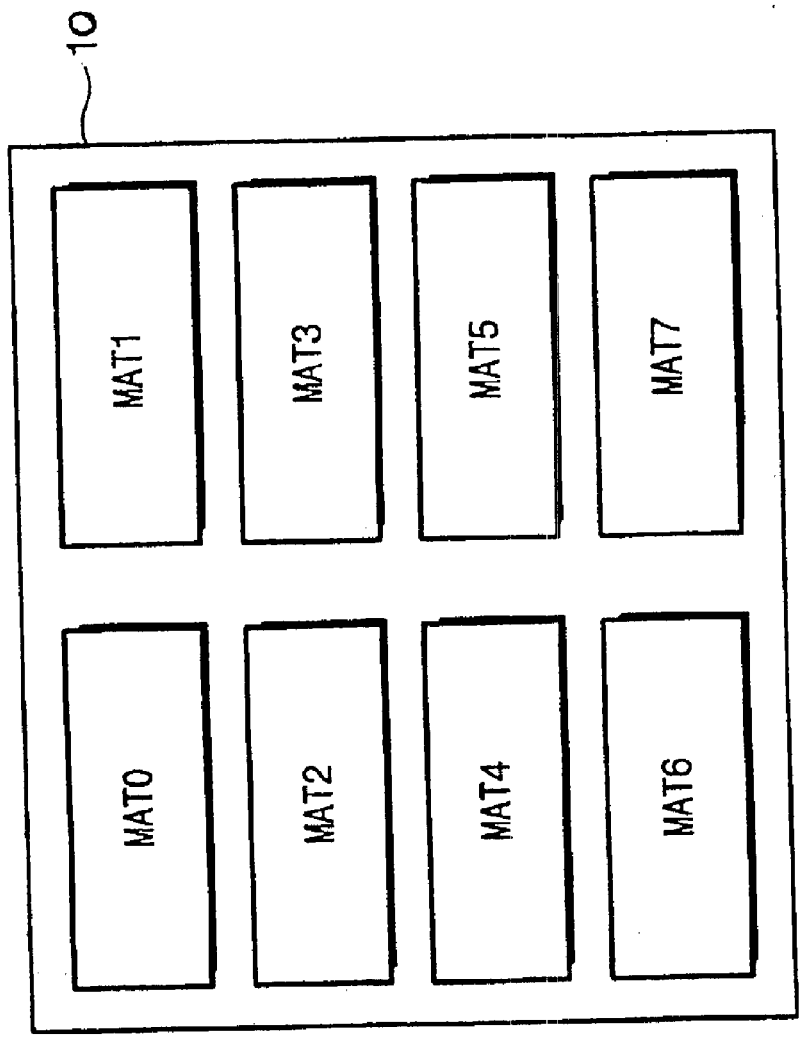
FIG. 1 is a block diagram of a semiconductor memory device with multiple memory arrays.
Figure 2:
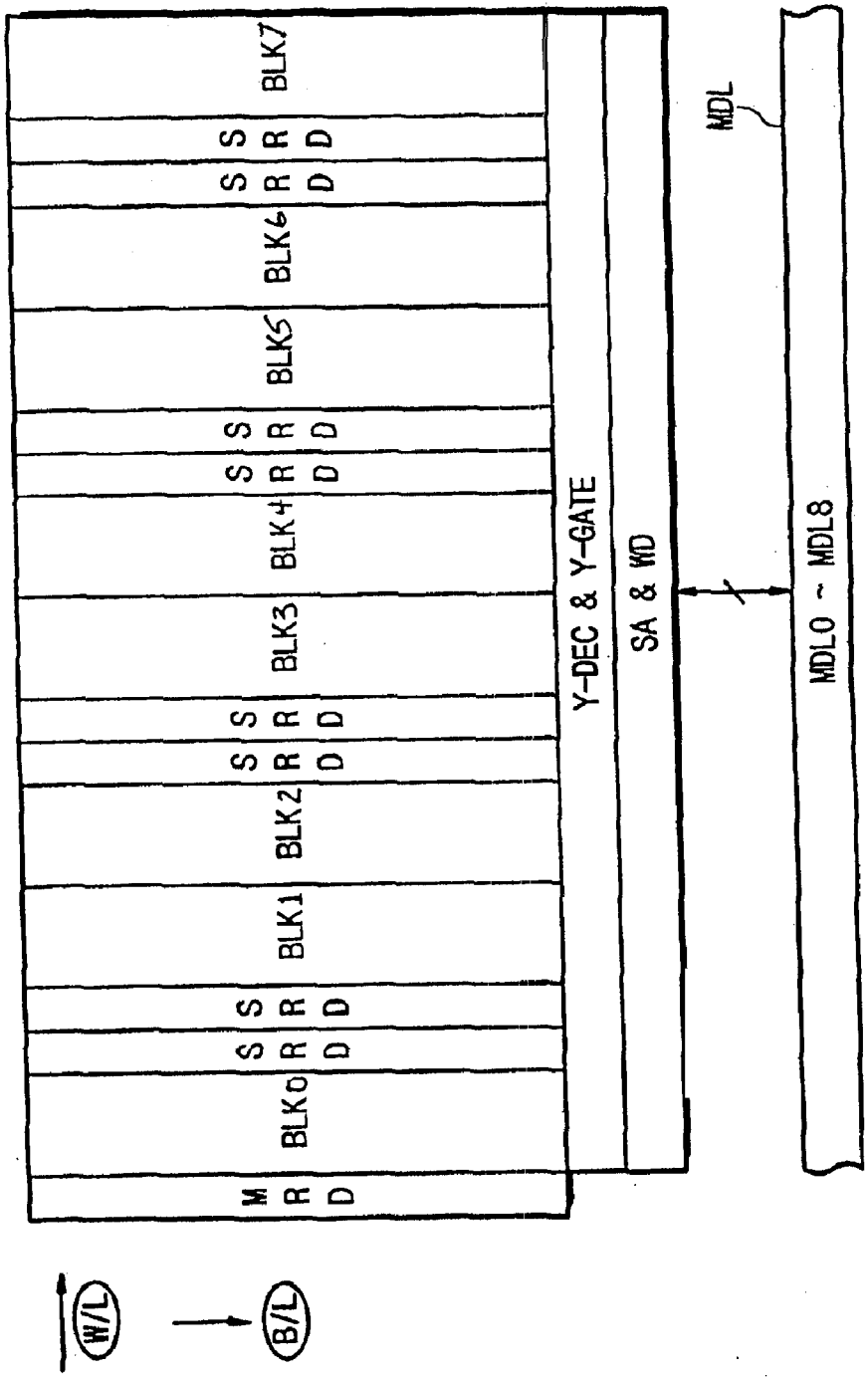
FIG. 2 is a block diagram of a memory array in the device of FIG. 1.

FIG. 1 contains a block diagram of a conventional semiconductor memory device with data input/output organization defined in multiples of nine bits. The semiconductor memory device 10 includes eight memory arrays MAT0 to MAT7 that are arranged in regions of four rows and two columns. FIG. 2 is a detailed block diagram of a memory array of FIG. 1, for example, memory array MAT0. Referring to FIGS. 1 and 2, each of the memory arrays includes a plurality of memory blocks BLK0 to BLK7, a main row decoder circuit MRD, section row decoder circuits SRD, a column decoder & column gate block Y-DEC & Y-GATE and a sense amplifier and write driver block SA & WD.

Referring to FIG. 2, the main row decoder circuit MRD selectively drives main word lines that are arranged in the row direction (not shown). Each of the section row decoder circuits SRD selectively drives section word lines of corresponding memory blocks. The column decoder and column gate block Y-DEC & Y-GATE selects columns of the selected memory block, for example, nine columns in the case of data input/output organization in multiples of nine (hereinafter "X9"), and electrically connects the selected columns to the sense amplifier and write driver block SA & WD.

During a read operation, the sense amplifier and write driver block SA & WD senses data from selected memory block through selected rows, and the sensed data is transferred to a data bus MDL. In FIG. 2, a data bus comprises nine data lines MDL0 to MDL8. During a write operation, the sense amplifier and write driver block SA & WD transfers write data on the data bus MDL to the selected columns of the selected memory block through the column decoder and column gate block Y-DEC & Y-GATE.

Figure 3:
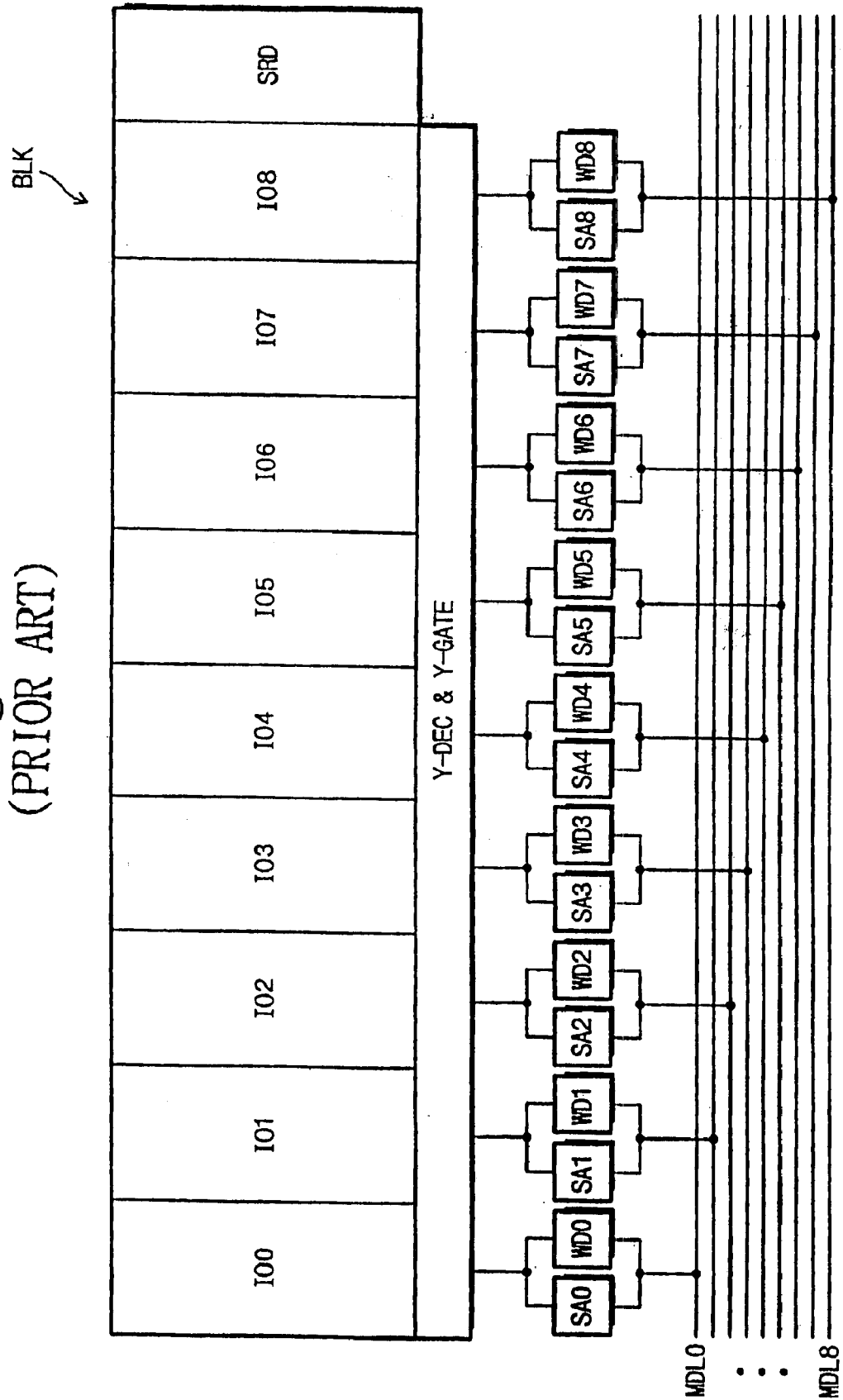
FIG. 3 is a block diagram of a memory block in the memory array of FIG. 2.

FIG. 3 contains a detailed block diagram of a memory block BLK of FIG. 2. FIG. 3 shows the memory block and its peripheral circuit blocks as illustrated in FIG. 2. Referring to FIG. 3, a memory block BLK comprises nine memory block segments IO0 to IO8. A column decoder and column gate block Y-DEC & Y-GATE is a column selection circuit, and it selects one of the columns of each memory block segment IO0 to IO8. That is, nine columns are selected. During a read operation, sense amplifiers SA0 to SA8 sense one bit data from respective memory block segments IO0 to IO8 through the corresponding selected columns, and the selected nine-bit data is transferred to the corresponding data lines.

A read operation of the semiconductor memory device with data input/output organization in multiples of 18 (X18), 36 (X36) or 72 (X72) will be described more fully below. As discussed above, a semiconductor memory device 10 in FIG. 1 comprises eight memory arrays and each array comprises eight memory blocks BLK0 to BLK7, and each memory block comprises nine memory block segments IO0 to IO8.

FIG. 4A shows a method for outputting data relating to a X72 single data rate (SDR) read operation or a X36 double data rate DDR read operation. During a X72 SDR read operation, nine bits of data are read simultaneously in each memory array and eventually seventy-two bits of data will be simultaneously output externally. During a X36 DDR read operation, nine-bit data is read simultaneously in each memory array as in the X72 SDR read operation. However, half of the seventy-two bits of data (thirty-six bits) is output externally in synchronization with the rising edge (or falling edge) of a clock signal and the other half (thirty-six bits) is output externally in synchronization with the falling edge (or rising edge) of the clock signal.

FIG. 4B contains a block diagram showing a data output scheme relating to a X36 SDR read operation or a X18 DDR read operation. During a X36 SDR read operation, nine bits of data are simultaneously read in each memory array. Half of the eight memory arrays MAT0 to MAT7 should be selected in order to output thirty-six bits of data externally. As shown in FIG. 4B, the selection of the memory arrays is executed by a multiplexing method. Four multiplexors are required in order to select four memory arrays from the eight memory arrays. For example, a multiplexor MUX0 selects one of the two memory arrays MAT0, MAT2 and a multiplexor MUX1 selects one of the two memory arrays MAT1, MAT3 to output the nine bit-data from the selected memory arrays. A multiplexor MUX2 selects one of the two memory arrays MAT4, MAT6 and outputs the nine-bit data from the selected memory array. A multiplexor MUX3 selects one of the two memory arrays MAT5, MAT7 and outputs the nine-bit data from the selected memory array. Thus, thirty-six bits of data are output externally by the multiplexing method. In the case of a X18 DDR read operation, half (eighteen bits) of the thirty-six-bit data is output externally in synchronization with the rising edge (or falling edge) of a clock signal and the other half (eighteen bits) is output externally in synchronization with the falling edge (or rising edge) of the clock signal.

FIG. 4C contains a block diagram showing a data output scheme relating to a X18 SDR read operation or a X9 DDR read operation. In this approach, six multiplexors MUX0 to MUX5 are used for the purpose of a X18 SDR read operation. As shown in FIG. 4C, eighteen bits of data may be output externally by a two-stage multiplexing method. Similarly, in the case of a X9 DDR read operation, half (nine bits) of the eighteen bits of data are output externally in synchronization with the rising edge (or falling edge) of a clock signal and the other half (nine bits) are output externally in synchronization with the falling edge (or rising edge) of the clock signal.

As described above, the nine-bit data is always read from each memory array (or selected memory array). Thus, a semiconductor memory device as shown in FIG. 1 has as a drawback that the device performance or operating characteristics are changed depending on the data input/output organization (X9, X18, X36 or X72). The reason is that data is selectively output using a multiplexing method. For example, during the X72 SDR/X36 DDR read operation, as shown in FIG. 4A, the selection of memory arrays is not executed using a multiplexing method. On the other hand, during the X36/X18 SDR read operation or the X18/X9 DDR read operation, as shown in FIGS. 4B and 4C, the selection of memory arrays is executed using a multiplexing method. The device performance is changed depending on the data input/output organization (X9, X18, X36 or X72). Therefore, it is difficult for the semiconductor memory device as shown in FIG. 1 to maintain uniform performance or uniform operating characteristics regardless of the data input/output organization.

SUMMARY OF THE INVENTION

An object of the present invention is, therefore, to provide a semiconductor memory device having uniform performance regardless of a data input/output organization.

Another object of the present invention is to provide a semiconductor memory device having uniform operating speed regardless of the data input/output organization.

Another object of the present invention is to provide a semiconductor memory device for reducing power consumption.

The invention is directed to a semiconductor memory device and a method of processing data in a semiconductor memory device. The device includes a plurality of memory arrays, a quantity of the memory arrays being an odd number. A control circuit is associated with the memory arrays. The control circuit generates control signals and provides the control signals to the memory arrays such that data can be input and output to and from the semiconductor memory device in multiples of nine bits. In one embodiment, the control signals are sense amplifier control signals. The sense amplifier control signal selectively activates sense amplifiers in the memory arrays. A first of the memory arrays receives two of the control signals. Each of the two control signals can be associated with four bits of data. A second of the memory arrays can receive eight of the control signals, and each of the eight control signals can be associated with a single bit of data. Each of the control signals can be received by a plurality of the memory arrays.

One of the memory arrays is associated with a quantity of bits, the quantities including one bit, two bits, four bits and eight bits. The number of bits depends upon the data input/output operational configuration of the memory device. One of the configurations is a by-nine (X9) operational configuration. In that configuration, each of two of the memory arrays is associated with four bits, and a third memory array is associated with a single bit. In a by-eighteen (X18) operational configuration, each of four of the memory arrays is associated with four bits, and a fifth memory array is associated with two bits. In a by-thirty-six (X36) operational configuration, each of eight of the memory arrays is associated with four bits, and a ninth memory array is associated with four bits. In a by-seventy-two (X72) operational configuration, each of eight of the memory arrays is associated with eight bits, and a ninth memory array is associated with eight bits.

In one embodiment, the memory arrays are comprised of a plurality of first memory arrays and at least one second memory array. The arrays are arranged in three columns and three rows. In one embodiment, a third memory array and/or a peripheral circuit, which can include the control circuitry of the invention, is included in the memory device. The third memory array can be a redundant array to at least one of the first and second memory arrays. The third array and/or the peripheral circuitry can be formed in the memory circuit such that it divides at least one of the memory arrays. In one particular embodiment, the redundant memory array and/or the peripheral circuitry divides the memory array in half.

In one embodiment, each memory array comprises eight memory blocks, and each memory block comprises eight memory segments. The memory device of the invention can be a static random-access memory (SRAM).

In one embodiment, the plurality of memory arrays all have the same input/output configuration. The memory arrays may all have the same memory density, or at least two of the memory arrays have different memory densities.

In one embodiment, the memory device includes nine memory arrays. In another embodiment, the quantity of memory arrays is an integer multiple of nine.

In one embodiment, the memory arrays comprise a plurality of first memory arrays which are selectively activated during a read or write operation and a second memory array which is activated by the control signals during every read or write operation.

The invention provides numerous advantages over other memory input/output organizational configurations. For example, by using an odd number of memory arrays, data can be readily input and output from the memory in multiples of nine bits, without using complex circuitry used in prior approaches. Specifically, the invention can be implemented without using the multiplexing schemes found in prior art approaches. The elimination of this complexity substantially reduces the power consumption of the memory device of the invention and also results in an increase in the speed of operation.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 1 is a block diagram of a semiconductor memory device with multiple memory arrays.

FIG. 2 is a block diagram of a memory array in the device of FIG. 1.

FIG. 3 is a block diagram of a memory block in the memory array of FIG. 2.

FIGS. 4A–4C contain block diagrams illustrating methods for outputting data relating to a X72/X36/X18 SDR read operation or a X36/X18/X9 DDR read operation in the memory device of FIG. 1.

FIG. 5 is a block diagram of a semiconductor memory device with data input/output organization in multiples of nine bits in accordance with the present invention.

FIG. 6 is a block diagram of a memory array in the device of FIG. 5.

FIG. 7 is a block diagram of a control circuit in accordance with the present invention.

FIG. 8 is a block diagram of a memory array in the device of FIG. 5.

FIG. 9 is a block diagram of another memory array in the device of FIG. 5.

FIG. 10 is a circuit diagram of a control circuit as shown in FIG. 7.

FIG. 11 is a schematic plan view illustrating a layout scheme of a semiconductor memory device having a peripheral circuit and a redundancy circuit in accordance with the present invention.

DETAILED DESCRIPTION OF PREFERRED EMBODIMENTS OF THE INVENTION

FIG. 5 is a block diagram of a semiconductor memory device 100 according to an embodiment of the present invention. Referring to FIG. 5, the semiconductor memory device 100 according to the present invention may be a static random access memory (SRAM). It will be understood, however, to one skilled in the art, that a semiconductor memory device 100 according to the present invention may be another type of memory device, for example, DRAM, flash memory device, FRAM, EEPROM, ROM, etc.

In one embodiment, a semiconductor memory device 100 according to the present invention includes nine memory arrays MAT0 to MAT8 that are arranged in regions of three rows and three columns. For example, if the density of the semiconductor memory device 100 as shown in FIG. 5 is 72M bits, the density of each memory array is 8M bits. In one embodiment, all of the arrays have the same density. However, the invention is applicable to systems in which all of the arrays do not have the same density.

Each memory array in the semiconductor memory device according to the present invention includes a plurality of memory blocks for storing data. FIG. 6 is a block diagram illustrating one of the memory arrays, for example, MAT0, shown in FIG. 5. Referring to FIGS. 5 and 6, in one embodiment of the present invention, each memory array MAT0 to MAT8 includes eight memory blocks BLK0 to BLK7. For example, if the density of each memory array is 8M bits, the density of each memory block is 1M bits.

Referring to FIG. 6, a memory array (for example, MAT0) further includes a main row decoder circuit MRD, section row decoder circuits SRD, a column decoder and column gate block Y-DEC & Y-GATE and a sense amplifier and write driver block SA & WD. The main row decoder circuit MRD selectively drives main word lines that are arranged in the row direction (not shown). Each of the section row decoder circuits SRD selectively drives section word lines of the corresponding memory blocks (not shown). A column decoder and column gate block Y-DEC & Y-GATE selects columns of the selected memory block, for example, eight columns in the case of a data input/output organization of X9.

During a read operation, the sense amplifier and write driver block SA & WD senses data from selected memory block through selected rows, and the sensed data is transferred to a data bus MDL. During a write operation, the sense amplifier and write driver block SA & WD transfers write data on the data bus MDL to the selected columns of the selected memory block through the column decoder and column gate block Y-DEC & Y-GATE. According to one embodiment of the present invention, the data bus MDL comprises eight data lines MDL0 to MDL7, and each memory block comprises eight memory block segments.

FIG. 7 contains a block diagram which illustrates an accessing approach according to the present invention, using the memory block segments. Referring to FIG. 7, the semiconductor memory device 100 includes a control circuit 120 that controls each sense amplifier and each write driver of memory blocks in each memory array. For example, the control circuit 120 generates enable signals EN0 to EN7 in response to mode selection signals DR7236, DR3618 and DR1809 and address signals A1 to A3. Four-bit data or eight-bit data is read in each memory array MAT0 to MAT3 and MAT5 to MAT8, depending on the selective activation of the enable signals EN0 to EN7. Also, one-bit data, two-bit data, four-bit data or eight-bit data is read in the memory array MAT4, depending on the selective activation of the enable signals EN0 to EN7.

For example, during a X9 SDR read operation, if an enable signal EN7 is activated, four-bit data is read in each memory array MAT3, MAT5, and one-bit data is read in the memory array MAT4. Thus, the nine-bit data is output externally without using a multiplexing method as shown in FIGS. 4B-4C. During a X18 SDR read operation, if enable signals EN0, EN4 are activated, four-bit data is read in each memory array MAT0, MAT2, MAT6 and MAT8, and two-bit data is read in the memory array MAT4. Thus, eighteen bits of data are output externally without using a multiplexing method.

FIG. 8 shows a memory block and its peripheral circuit blocks of FIG. 7. A memory block BLK comprises eight memory block segments IO0 to IO7 as shown in FIG. 8. A section row decoder circuit SRD is a row selection circuit. The SRD selects at least one of the section word lines (not shown) arranged in the row direction in the memory blocks. A column decoder and column gate block Y-DEC & Y-GATE is a column selection circuit which selects columns of a memory block (for example, eight columns). That is, one column is selected per each memory block segment. The columns selected by a column decoder and column gate block Y-DEC & Y-GATE are connected to corresponding sense amplifiers SA0 to SA3. Four sense amplifiers located on one side SA0 to SA3 are controlled by enable signals EN0, EN2, EN4 and EN6, and four sense amplifiers located on the other side SA4 to SA7 are controlled by enable signals EN1, EN3, EN5 and EN7.

For example, if an enable signal EN0 is activated and an enable signal EN1 is inactivated, then sense amplifiers SA0 to SA3 execute a sensing operation, and sense amplifiers SA4 to SA7 do not execute a sensing operation. Therefore, four-bit data is read. If enable signals EN0 and EN1 are activated, all the sense amplifiers SA0 to SA7 execute a sensing operation. Thus, eight-bit data is read. Four-bit data (or eight-bit data) is read or written in each memory arrays MAT0 to MAT3, MAT5 to MAT8. For the sake of convenience, write drivers are not shown in FIG. 8. However, it is apparent to one of skill in the art that those write drivers are controlled by the same method as the sense amplifiers SA0 to SA7.

FIG. 9 shows a memory block of the memory array MAT4 and its peripheral circuit blocks as shown in FIG. 7. Circuit elements in FIG. 9 are the same as circuit elements in FIG. 8 except for the method for controlling sense amplifiers SA0 to SA7. Sense amplifiers of the corresponding memory blocks of the memory array MAT4 located in the center of the memory circuit of the invention (see FIG. 5) are controlled independently. According to these control methods, one-bit data, two-bit data, four-bit data or eight-bit data can be output from the memory array MAT4. For the sake of convenience, write drivers are not shown in FIG. 9. However, it is apparent to one of skill in the art that those write drivers are controlled by the same method as sense amplifiers SA0 to SA7.

FIG. 10 illustrates a circuit diagram showing a preferred embodiment of a control circuit shown in FIG. 7. Referring to FIG. 10, a control circuit 120 in accordance with the present invention generates enable signals EN0 to EN7 in response to mode selection signals DR7236, DR3618 and DR1809 and address signals A1 to A3, and as shown in FIG. 10, includes six OR-gates G11 to G16, three inverters INV11 to INV13 and eight AND gates G17 to G24. The mode selection signal DR7236 is used for selecting a X72 SDR read operation mode or a X36 DDR read operation mode, and the mode selection signal DR3618 is used for selecting a X36 SDR read operation mode or a X18 DDR read operation mode, and the mode selection signal DR1809 is used for selecting a X18 SDR read operation mode or a X9

DDR read operation mode. It is apparent to one of skill in the art that the mode selection signals may be programmed internally using an option circuit, or programmed externally.

Table 1 shows the logic status of the mode selection signals DR7236, DR3618 and DR1809 according to each operation mode.

With reference to Table 1, if all of mode selection signals DR7236, DR3618 and DR1809 have a logic "H" (high) level, then a X72 SDR read operation or a X36 DDR read operation is executed. At this time, all of enable signals EN0 to EN7 have a logic "H" level regardless of the logic status of the address signals A1 to A3.

TABLE 1

|  | X9SDR | X18SDR OR X9DDR | X36SDR OR X18DDR | X72SDR OR X36DDR |
|---|---|---|---|---|
| DR7236 | L | L | L | H |
| DR3618 | L | L | H | H |
| DR1809 | L | H | H | H |

If the mode selection signal DR7236 has a logic "L" (low) level and the mode selection signals DR3618, DR1809 have a logic "H" level, then a X36 SDR read operation or a X18 DDR read operation is executed. If the address signal A1 has a logic "L" level, enable signals EN2, EN3, EN6 and EN7 are activated and enable signals EN0, EN1, EN4 and EN5 are inactivated, regardless of the address signals A2, A3. If the address signal A1 has a logic "H" level, enable signals EN0, EN1, EN4 and EN5 are activated and enable signals EN2, EN3, EN6 and EN7 are inactivated, regardless of the address signals A2, A3.

If the mode selection signals DR7236, DR3618 have a logic "L" level and the mode selection signal DR1809 has a logic "H" level, then a X18 SDR read operation or a X9 DDR read operation is executed. The logic status of the enable signals EN0 to EN7 is decided regardless of the address signals A3. If the addresses A2A1 have logic "LL" levels, then the enable signals EN3, EN7 are activated. If the addresses A2A1 have logic "LH" levels, then the enable signals EN1, EN5 are activated. If the addresses A2A1 have logic "HL" levels, then the enable signals EN2, EN6 are activated. If the addresses A2A1 have logic "HH" levels, then the enable signals EN0, EN4 are activated.

If all of mode selection signals DR7236, DR3618 and DR1809 have a logic "L" level, then a X9 SDR read operation is executed. If the addresses A3A2A1 have logic "LLL" levels, then the enable signal EN7 is activated. If the addresses A3A2A1 have logic "LLH" levels, then the enable signal EN5 is activated. If the addresses A3A2A1 have logic "LHL" levels, then the enable signal EN6 is activated. If the addresses A3A2A1 have logic "LHH" levels, then the enable signal EN4 is activated. If the addresses A3A2A1 have logic "HLL" levels, then the enable signal EN3 is activated. If the addresses A3A2A1 have logic "HLH" levels, then the enable signal EN1 is activated. If the addresses A3A2A1 have logic "HHL" levels, then the enable signal EN2 is activated. If the addresses A3A2A1 have logic "HHH" levels, then the enable signal EN0 is activated.

Table 2 summarizes the above described combinations of logic states of the mode selection signals, addresses and enable signals.

TABLE 2

| A3A2A1 | X9SDR | X18SDR OR X9DDR | X36SDR OR X18DDR | X72SDR OR X36DDR |
|---|---|---|---|---|
| 000 | EN7 | EN3, EN7 | EN2, EN3, EN6, EN7 | EN0-EN7 |
| 001 | EN5 | EN1, EN5 | EN0, EN1, EN4, EN5 | EN0-EN7 |
| 010 | EN6 | EN2, EN6 | EN2, EN3, EN6, EN7 | EN0-EN7 |
| 011 | EN4 | EN0, EN4 | EN0, EN1, EN4, EN5 | EN0-EN7 |
| 100 | EN3 | EN3, EN7 | EN2, EN3, EN6, EN7 | EN0-EN7 |
| 101 | EN1 | EN1, EN5 | EN0, EN1, EN4, EN5 | EN0-EN7 |
| 110 | EN2 | EN2, EN6 | EN2, EN3, EN6, EN7 | EN0-EN7 |
| 111 | EN0 | EN0, EN4 | EN0, EN1, EN4, EN6 | EN0-EN7 |

The X9 (X18, X36 or X72) SDR read operation of the semiconductor memory device 100 in accordance with the present invention will now be described. Mode selection signals DR7236, DR3618 and DR1809 are set to a logic "H" level in order to execute a X72 SDR read operation. Because mode selection signals DR7236, DR3618 and DR1809 have a logic "H" level, enable signals EN0 to EN7 are activated regardless of the logic status of the address signals A3A2A1. Thus sense amplifiers of the selected memory block of each memory array MAT0 to MAT8 are activated. Therefore, seventy-two-bit data is read and output externally at one time during a X72 SDR read operation. During a X36 DDR read operation, half (thirty-six-bit data) of the seventy-two-bit data is output externally in synchronization with the rising edge (or falling edge) of a clock signal and the other half (thirty-six-bit data) is output externally in synchronization with the falling edge (or rising edge) of the clock signal.

With the mode selection signal DR1809 in a logic "H" level and the mode selection signal DR7236 in a logic "L" level, if the address signal A1 has a logic "L" level, enable signals EN2, EN3, EN6, EN7 are activated. Eight bits of data are output from each memory array MAT1, MAT3, MAT5, MAT7 as a result of being activated by all of the sense amplifiers of selected memory blocks of each memory array MAT1, MAT3, MAT5, MAT7. At the same time, four-bit data is output from the memory array MAT4 as a result of being activated by four sense amplifiers of selected memory blocks of the memory array MAT4. Therefore, thirty-six-bit data is output from memory arrays MAT1, MAT3, MAT4, MAT5, MAT7 without using a multiplexing method. The thirty-six-bit data is output at one time externally in SDR mode. In a DDR mode, half (eighteen-bit data) of the thirty-six-bit data is output externally in synchronization with the rising edge (or falling edge) of a clock signal and the other half (eighteen-bit data) is output externally in synchronization with the falling edge (or rising edge) of the clock signal. If the address signal has a logic "H" level, enable signals EN0, EN1, EN4, EN5 are activated. According to the same method as describe above, eight bits of data are output from each memory array MAT0, MAT2, MAT8, MAT8 and four-bit data is output from the memory array MAT4.

The X18 SDR read operation is executed by setting mode selection signals DR7236, DR3618 in a logic "L" level and the mode selection signal DR1809 in a logic "H" level. As described above, two enable signals are activated according to the address signals A3A2A1 in this case. For example, if the address signals A2, A1 have a logic "H" level, enable signals EN3, EN7 are activated and four bits of data are output from each memory array MAT1, MAT3, MAT5, MAT7 and two-bit data is output from the memory array MAT4. Therefore, eighteen bits of data are output from memory arrays MAT1, MAT3, MAT4, MAT5, MAT7 without using a multiplexing method. The eighteen-bit data is output at one time externally in the SDR mode. In the DDR mode, half (nine-bit data) of the eighteen bit data is output externally in synchronization with the rising edge (or falling edge) of a clock signal and the other half (nine-bit data) is output externally in synchronization with the falling edge (or rising edge) of the clock signal. If the combination of the address signals A3, A2, A1 is different from the above, eighteen-bit data may be read from five memory arrays in the same method as described above.

If mode selection signals DR7236, DR3618, DR1809 have a logic "L" level, a X9 SDR read operation can be executed. If address signals A3, A2, A1 have logic "LLL" levels, the enable signal EN7 is activated and four bits of data are output from each memory array MAT3, MAT5 and one bit data is output from the memory array MAT4. Therefore, nine bits of data can be read from memory arrays without using a multiplexing method. If the combination of the address signals A3, A2, A1 is different from the above, the nine-bit data may be read from three memory arrays in the same method as described above.

FIG. 11 shows a layout of a semiconductor memory device having a peripheral circuit and a redundancy circuit in accordance with the present invention. Referring to FIG. 11, the semiconductor memory device in accordance with the present invention has each of the memory arrays MAT1, MAT4, MAT7 of the second column divided in two sections. In one embodiment, each of the arrays is divided in half. The peripheral circuit and the redundancy circuit are located in the divided region. Data I/O pads, address and control pads and data I/O circuits are located in an edge region of the chip.

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. A semiconductor memory device, comprising:
a plurality of first memory arrays, a quantity of the first memory arrays being an even number;
a single second memory array comprising a plurality of memory blocks; and
a control circuit associated with each of the first and second memory arrays, the control circuit generating control signals and providing the control signals to the first and second memory arrays such that data is input and output to and from the semiconductor memory device in multiples of nine bits; wherein
one of the memory arrays is associated with a quantity of bits of one of one, two, four and eight bits, depending on a data input/output operational configuration of the memory device.

2. The semiconductor memory device of claim 1, wherein the control signals are sense amplifier control signals, the sense amplifier control signals selectively activating sense amplifiers in the memory arrays.

3. The semiconductor memory device of claim 1, wherein, in a by-nine operational configuration, each of two of the first memory arrays is associated with four bits, and the second memory array is associated with a single bit.

4. The semiconductor memory device of claim 1, wherein, in a by-eighteen operational configuration, each of four of the first memory arrays is associated with four bits, and the second memory array is associated with two bits.

5. The semiconductor memory device of claim 1, wherein, in a by-thirty-six operational configuration, each of four of the first memory arrays is associated with eight bits, and the second memory array is associated with four bits.

6. The semiconductor memory device of claim 1, wherein, in a by-seventy-two operational configuration, each of eight of the first memory arrays is associated with eight bits, and the second memory array is associated with eight bits.

7. The semiconductor memory device of claim 1, wherein the memory arrays are arranged in three columns and three rows.

8. The semiconductor memory device of claim 7, further comprising a third memory array redundant to at least one of the first and second memory arrays.

9. The semiconductor memory device of claim 8, wherein the at least one of the first and second memory arrays is divided in half.

10. The semiconductor memory device of claim 7, further comprising a peripheral circuit formed on the semiconductor memory device.

11. The semiconductor memory device of claim 10, wherein the peripheral circuit is formed dividing at least one of the first and second memory arrays.

12. The semiconductor memory device of claim 11, wherein the at least one of the first and second memory arrays is divided in half.

13. The semiconductor memory device of claim 7, further comprising a third memory array redundant to at least one of the first and second memory arrays and a peripheral circuit formed on the semiconductor memory device.

14. The semiconductor memory device of claim 13, wherein the third memory array and the peripheral circuit are formed dividing at least one of the first and second memory arrays.

15. The semiconductor memory device of claim 1, wherein each memory array comprises eight memory blocks and each memory block comprises eight memory segments.

16. The semiconductor memory device of claim 1, wherein all of the plurality of memory arrays have the same input/output operational configuration.

17. The semiconductor memory device of claim 1, wherein the quantity of memory arrays is nine.

18. The semiconductor memory device of claim 1, wherein the quantity of memory arrays is an integer multiple of nine.

19. The semiconductor memory device of claim 1, wherein the memory arrays comprise a plurality of first memory arrays which are selectively activated during a read or write operation and a second memory array which is activated by the control signals during every read or write operation.

20. The semiconductor memory device of claim 1, wherein the memory arrays all have the same memory density.

21. A method of processing data in a semiconductor memory device, comprising:
providing a plurality of first memory arrays, a quantity of the first memory arrays being an even number;
providing a single second memory array comprising a plurality of memory blocks; and
generating control signals and providing the control signals to the first and second memory arrays such that data is input and output to and from the semiconductor memory device in multiples of nine bits; wherein one of the memory arrays is associated with a quantity of bits of one of one, two, four and eight bits, depending on a data input/output operational configuration of the memory device.

22. The method of claim 21, wherein the control signals are sense amplifier control signals, the sense amplifier control signals selectively activating sense amplifiers in the memory arrays.

23. The method of claim 21, wherein, in a by-nine operational configuration, each of two of the first memory arrays is associated with four bits, and the second memory array is associated with a single bit.

24. The method of claim 21, wherein, in a by-eighteen operational configuration, each of four of the first memory arrays is associated with four bits, and the second memory array is associated with two bits.

25. The method of claim 21, wherein, in a by-thirty-six operational configuration, each of four of the first memory arrays is associated with eight bits, and the second memory array is associated with four bits.

26. The method of claim 21, wherein, in a by-seventy-two operational configuration, each of eight of the first memory arrays is associated with eight bits, and the second memory array is associated with eight bits.

27. The method of claim 21, wherein, in a by-nine operational configuration, each of the first memory arrays and the second memory array is associated with one bit of data.

28. The method of claim 21, wherein, in a by-eighteen operational configuration, each of the first memory arrays and the second memory array is associated with two bits of data.

29. The method of claim 21, wherein, in a by-thirty-six operational configuration, each of the first memory arrays and the second memory array is associated with four bits of data.

30. The method of claim 21, wherein each memory array comprises eight memory blocks and each memory block comprises eight memory segments.

31. The method of claim 21, wherein all of the plurality of memory arrays have the same input/output operational configuration.

32. The method of claim 21, wherein the quantity of memory arrays is nine.

33. The method of claim 21, wherein the quantity of memory arrays is an integer multiple of nine.

34. The method of claim 21, wherein the memory arrays comprise a plurality of first memory arrays which are selectively activated during a read or write operation and a second memory array which is activated by the control signals during every read or write operation.

35. A semiconductor memory device, comprising:

nine memory arrays which are arranged in three columns and three rows, said nine memory arrays each having a plurality of memory blocks; and a control circuit associated with said nine memory arrays, said control circuit generating control signals and providing the control signals to the nine memory arrays such that data input and output to from said nine memory arrays is controlled;

wherein one of the memory arrays is associated with a plurality of bits of one of one, two, four and eight bits, depending on a data input/output operational configuration of the memory device.

36. A semiconductor memory device, comprising:

nine memory arrays which are arranged in three columns and three rows, said nine memory arrays each having a plurality of memory blocks; and a control circuit associated with said nine memory arrays, said control circuit generating control signals and providing the control signals to the nine memory arrays such that data input and output to from said nine memory arrays is controlled;

wherein, in a by-nine operational configuration, each of two of the first memory arrays is associated with four bits, and the second memory array is associated with a single bit.

* * * * *

UNITED STATES PATENT AND TRADEMARK OFFICE
CERTIFICATE OF CORRECTION

| | |
|---|---|
| PATENT NO. | : 6,909,661 B2 |
| APPLICATION NO. | : 10/602111 |
| DATED | : June 21, 2005 |
| INVENTOR(S) | : Yang et al. |

It is certified that error appears in the above-identified patent and that said Letters Patent is hereby corrected as shown below:

Column 6, line 22 delete "amplifies" and insert --amplifiers--

Column 8, line 19 delete "EN6" and insert --EN5--

Signed and Sealed this

Ninth Day of December, 2008

JON W. DUDAS
*Director of the United States Patent and Trademark Office*